(12) United States Patent
Matsuo et al.

(10) Patent No.: US 6,403,498 B1
(45) Date of Patent: Jun. 11, 2002

(54) METHOD AND DEVICE FOR TREATING SUBSTRATE

(75) Inventors: Takenobu Matsuo; Tsuyoshi Wakabayashi; Teruyuki Hayashi; Misako Saito, all of Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/194,539

(22) PCT Filed: Mar. 28, 1998

(86) PCT No.: PCT/JP98/01375

§ 371 (c)(1),
(2), (4) Date: Nov. 30, 1998

(87) PCT Pub. No.: WO98/44542

PCT Pub. Date: Oct. 8, 1998

(30) Foreign Application Priority Data

Mar. 28, 1997 (JP) .............................................. 9-077746

(51) Int. Cl.[7] .............................................. H01L 21/31
(52) U.S. Cl. ........................ 438/780; 438/660; 438/661; 438/679; 438/765
(58) Field of Search ................................. 438/780, 679, 438/765, 660, 661; 359/452, 489, 443

(56) References Cited

U.S. PATENT DOCUMENTS 5,032,462 A * 7/1991 Kim ........................... 428/501
6,144,491 A * 11/2000 Orikasa et al. ............. 359/452

* cited by examiner

*Primary Examiner*—David Nelms
*Assistant Examiner*—Reneé R. Berry
(74) *Attorney, Agent, or Firm*—Pillsbury Winthrop LLP

(57) ABSTRACT

A substrate processing method of processing a surface of a substrate in manufacture of a semiconductor device, characterized by comprising a surface processing step for making a substance having an adsorption heat higher than that of an organic matter whose adsorption on the surface of the substrate, which has been cleaned, is undesirable, adsorbed on the surface of the substrate, and a film formation step for forming a thin film on the surface of the substrate which was processed in the above step.

23 Claims, 19 Drawing Sheets

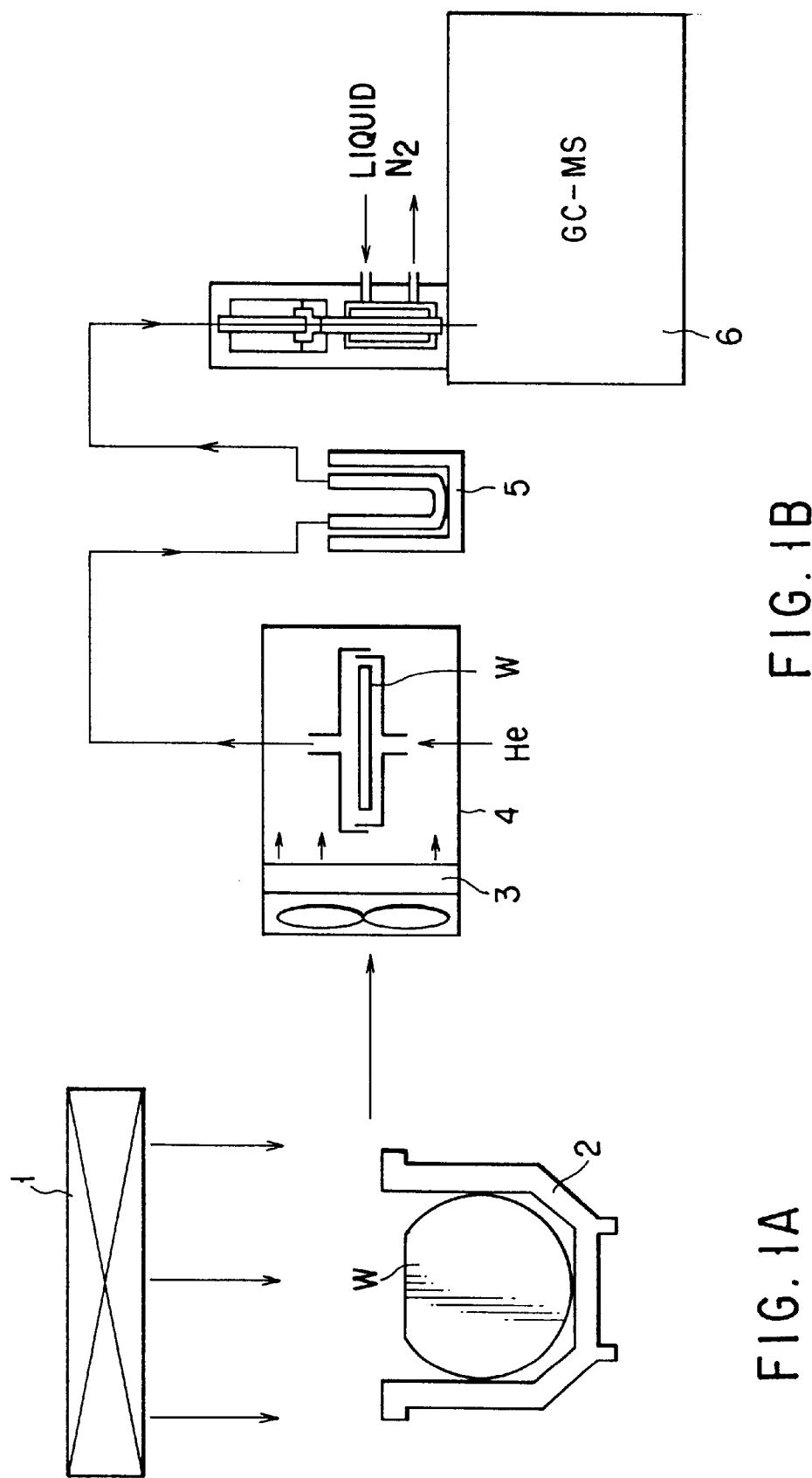

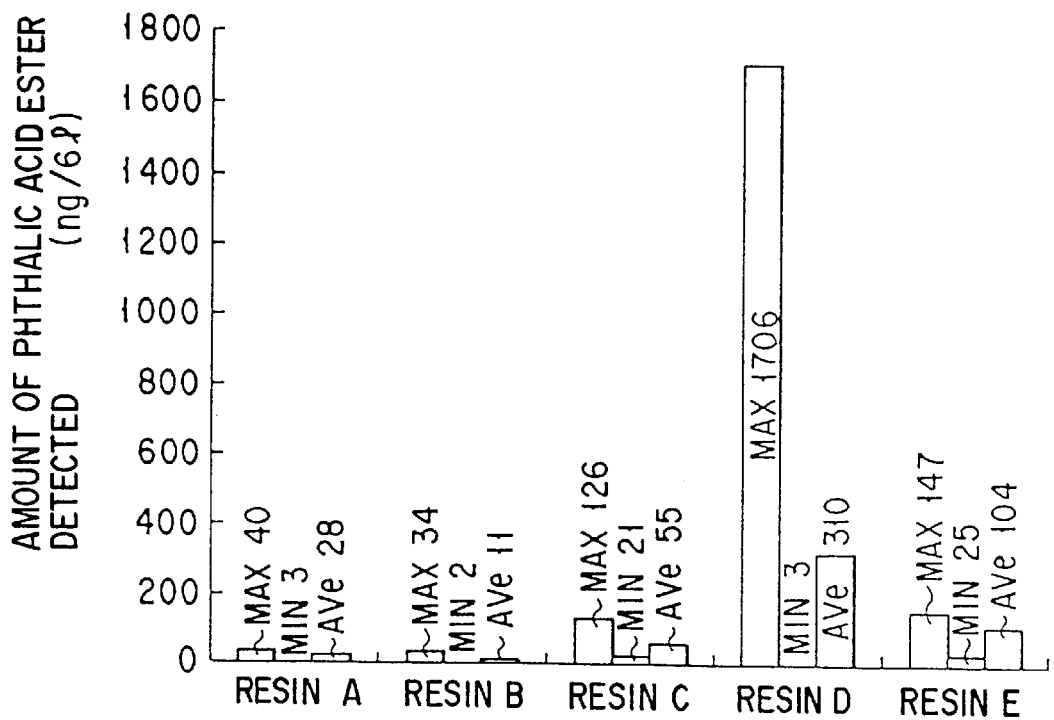
F I G. 21
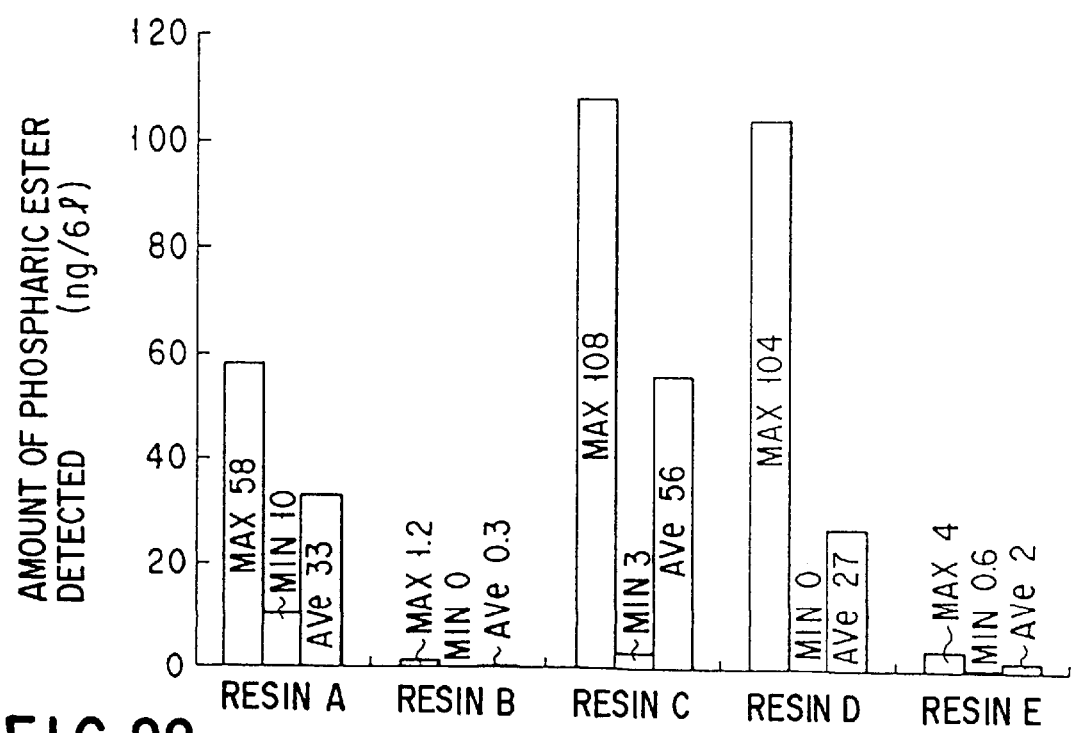
F I G. 22

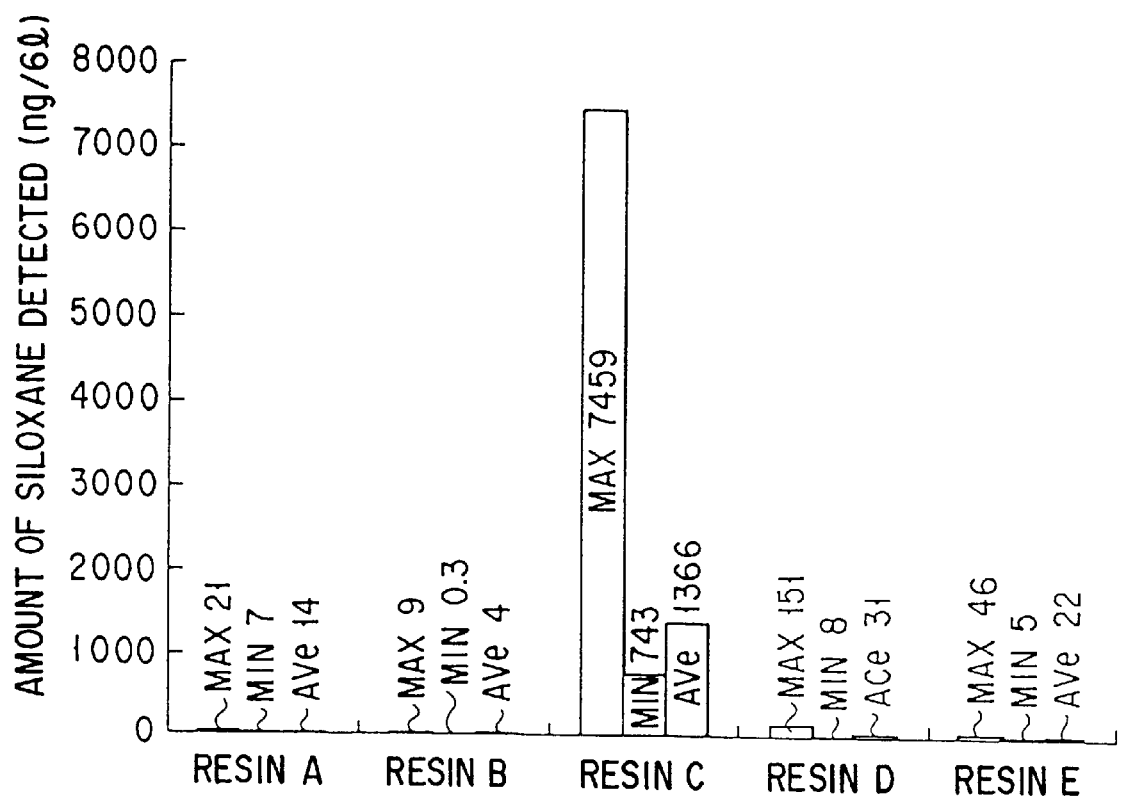
F I G. 23

METHOD AND DEVICE FOR TREATING SUBSTRATE

This application is the national phase of international application PCT/JP98/01375 filed Mar. 27, 1998 which designated the U.S.

1. TECHNICAL FIELD

The present invention relates to a substrate processing method and a substrate processing device, for processing the surface of a substrate used for the manufacture of a semiconductor device.

2. BACKGROUND ART

These days, in the semiconductor manufacturing process, the contamination of the surface of a substrate with an organic material (especially, a non-volatile organic material) is focused as a problem. More specifically, it is recently known that when a film forming process, for example, a process of forming a gate oxide film is carried out with an organic matter present on the surface of the substrate, the withstand voltage of the gate oxide film thus obtained is deteriorated.

Conventionally, there are several methods of preventing the contamination of the surface of a substrate with an organic matter, that is, a method of managing the time period of leaving the substrate outside (in a predetermined atmosphere) between processing steps, a method of housing the substrate in a box (miniature environment) or a stock container, having a predetermined atmosphere (for example, nitrogen gas atmosphere or degasified atmosphere), and a method of removing organic matters by a chemical filter from the atmosphere to which the substrate is exposed.

As the integration of semiconductor devices becomes high, the quality of each film in the semiconductor device is considered as being more important, and it becomes necessary to accurately remove organic matters. However, with the above-listed methods, it is not possible to fully prevent the contamination of a substrate with an organic matter, under the present status. Therefore, there has been a demand for a more certain method or means capable of preventing the contamination of a substrate with an organic matter.

3. DISCLOSURE OF INVENTION

The object of the present invention is to provide a substrate cleaning method and a substrate cleaning device, which are capable of effectively preventing the attachment of an organic matter on the surface of a substrate placed in a processing atmosphere, and maintaining the surface in a clean state such that the quality of a film formed thereon is not degraded.

The inventors of the present invention focused on the behavior of organic matters, that is, the adsorption to and detachment from a substrate within a clean room atmosphere, in the process of manufacturing semiconductor devices, and have found out that the behavior of the organic matters, that is, the adsorption and detachment, varies due to the difference in the absorption heat of an organic matter with respect to the substrate. Further, the inventors have found that the adsorption amount of organic matters differs between the cases where the surface of the substrate is hydrophilic and where it is hydrophobic. The present invention is based on these findings.

According to the present invention, there is provided a substrate processing method of processing a surface of a substrate in manufacture of a semiconductor device, characterized by comprising:

(a) a surface processing step for making a substance having an adsorption heat higher than that of an organic matter whose adsorption on the surface of the substrate, which has been cleaned, is undesirable, adsorbed on the surface of the substrate; and (b) a film formation step for forming a thin film on the surface of the substrate which was processed in the step (a).

In this case, it is preferable that in the step (a), a substance having an adsorption heat higher than that of dioctyl phthalate should be adsorbed on the surface of the substrate. Further, in the step (a), it is preferable that an organic compound of aliphatic hydrocarbons, excluding aromatic hydrocarbons, should be adsorbed on the surface of the substrate, and it is most preferable that triacontane should be adsorbed on the surface of the substrate. It should be noted that in the present invention the surface of the substrate is hydrophobic in many cases.

Further, it is preferable that after the step (b), the substance of the above step (a) should be adsorbed on the surface of the substrate, on which the film was formed. In this manner, harmful non-volatile organic matters for a film-formed surface such as a heat oxide film, are not adsorbed, and therefore it is very advantageous for the process to be carried out in a later step.

Further, it is preferable that before the step (a), the surface of the substrate should be subjected to a cleaning process, so as to remove organic matters from the surface of the substrate. In this case, it is preferable that the surface of the substrate is cleaned by a dry-type cleaning method or by a wet-type cleaning method. As the dry-type cleaning method, it is preferable that the ultraviolet ray irradiated ozone cleaning method should be employed. Further, as the wet-type cleaning method, it is preferable that a combination of a scrubbing method and mega-sonic method should be employed.

According to the present invention, a substance having an adsorption heat higher than that of an organic matter which should not be adsorbed on the surface of a substrate, which has been cleaned, is made adsorbed on the surface of the substrate, and therefore non-volatile organic matters which are harmful for the manufacture of a semiconductor device are not adsorbed on the surface of the substrate. Since such a surface processing substance is not easily desorbed from the surface of the substrate, its effect can be maintained for a long period of time. Further, such a surface processing substance is easily adsorbed on the surface of a substrate, it can be easily adsorbed on the surface of the substrate by a short-time process. Therefore, the film forming process can be carried out in the state that harmful non-volatile organic matters are not present on the surface of the substrate, thus remarkably improving the yield of the process.

According to the present invention, there is further provided a substrate processing method of processing a surface of a substrate in manufacture of a semiconductor device, characterized by comprising:

(A) a surface processing step for making a substance containing a hydroxy group or a ketone group, adsorbed on the surface of the substrate; and (B) a film formation step for forming a thin, film on the surface of the substrate which was processed in the step (A).

In this case, it is preferable that in the step (A), an organic compound of aliphatic hydrocarbons, except for the aromatic hydrocarbons, should be adsorbed on the surface of the substrate, and one or more organic compounds selected from the group consisting of isopropyl alcohol, 2-ethylhexanol, methyl alcohol and ethyl alcohol should be adsorbed on the surface of the substrate. It should be noted that in the present invention, the surface of the substrate is hydrophobic in many cases.

Further, it is preferable that after the step (B), the substance of the step (A) should be adsorbed on the surface of the substrate, on which the film was formed.

Furthermore, it is preferable that before the step (A), the surface of the substrate should be subjected to a cleaning process, so as to remove organic matters from the surface of the substrate. In this case, it is preferable that before the step (A), the surface of the substrate should be cleaned by a dry-type cleaning method or by a wet-type cleaning method. As the dry-type cleaning method, it is preferable that the ultraviolet ray irradiated ozone cleaning method should be employed. Further, as the wet-type cleaning method, it is preferable that a combination of a scrubbing method and mega-sonic method should be employed.

According to the present invention, a substance containing a hydroxy group or a ketone group is made adsorbed on the surface of the substrate, and therefore non-volatile organic matters which are harmful for the manufacture of a semiconductor device are not substantially adsorbed on the surface of the substrate. For example, when the substrate is subjected to a process with an HF (hydrogen fluoride), the surface becomes hydrophobic. To the hydrophobic surface, a much lower amount of harmful organic matter is adsorbed than to a hydrophlic surface, although it is never absent. Therefore, by attaching a substance containing a hydroxy group which is compatible with the hydrophobic surface, to the surface of the substrate, the adsorption of non-volatile organic matters which are present in the air can be avoided. Thus, the film formation process can be carried out on the surface of the substrate in the absence of non-volatile organic matters, and therefore it is possible to form a film exhibiting excellent characteristics, on a substrate.

According to the present invention, there is provided a substrate processing device for processing a surface of a substrate in manufacture of a semiconductor device, characterized by comprising: surface processing means for making a substance having an adsorption heat higher than that of an organic matter whose adsorption on the surface of the substrate, which has been cleaned, is undesirable, and/or a substance containing a hydroxy group or a ketone group, adsorbed on the surface of the substrate.

In this case, it is preferable that the surface processing means should make an organic compound of aliphatic hydrocarbons having an adsorption heat higher than that of dioctyl phthalate, adsorbed on the surface of the substrate, and it is most preferable that the surface processing means makes one or more of tricontane, isopropyl alcohol, 2-ethylhexanol, methyl alcohol and ethyl alcohol should be adsorbed on the surface of the substrate.

Further, it is preferable that the surface processing means should include heating means for directly or indirectly heating the substrate.

Furthermore, it is preferable that the substrate processing device should further comprise a plurality of processing vessels each containing a processing liquid for processing a substrate, and a transfer mechanism for transfer the substrate to load it in the processing vessel, wherein at least one of the processing vessel should contain a solution of the substance having a high adsorption heat, and the at least one processing vessel should serve as the surface processing means.

It is preferable that the processing vessel serving as the surface processing means should include means for immersing a substrate in the processing liquid. Thus, it becomes possible to attach a substance having a high adsorption heat or containing a hydroxy group, onto the surface of a substrate, surely without having unevenness.

Moreover, it is preferable that the processing vessel serving as the surface processing means should include means for spraying the processing liquid onto a substrate. Furthermore, it is preferable that the processing vessel serving as the surface processing means should include means for introducing a substrate in a gaseous processing liquid atmosphere. By employing the structure for spraying the solution liquid onto a substrate or the structure for introducing a substrate in a gaseous processing liquid atmosphere, the contact time periods in which the processing solution contacts the entire surface of the substrate become substantially the same, and therefore it becomes possible to attach a substance having a high adsorption heat and containing a hydroxy group, uniformly on the surface of the substrate. It should be noted that the processing liquid here means a solution of a substance having a high adsorption heat or a substance containing a hydroxy group or a ketone group.

Further, it is preferable that the processing vessel serving as the surface processing means is a chemical liquid vessel situated at the last stage. With this structure, it becomes possible to shorten the time period in which a substrate is exposed to the air up until the film formation process, after attaching a substance having a high adsorption heat or a substance containing a hydroxy group or a ketone group, uniformly to the surface of the substrate, and therefore the adsorption of non-volatile organic matters which cause an adverse influence on the film formation process, can be effectively prevented.

4. BRIEF DESCRIPTION OF DRAWINGS

FIG. 1A is a schematic diagram briefly showing a wafer cassette in a clean room, and FIG. 1B is a schematic diagram briefly showing a device for detecting and measuring an organic matter attached to a surface of a wafer.

Figures 3A, 3B, 3C:
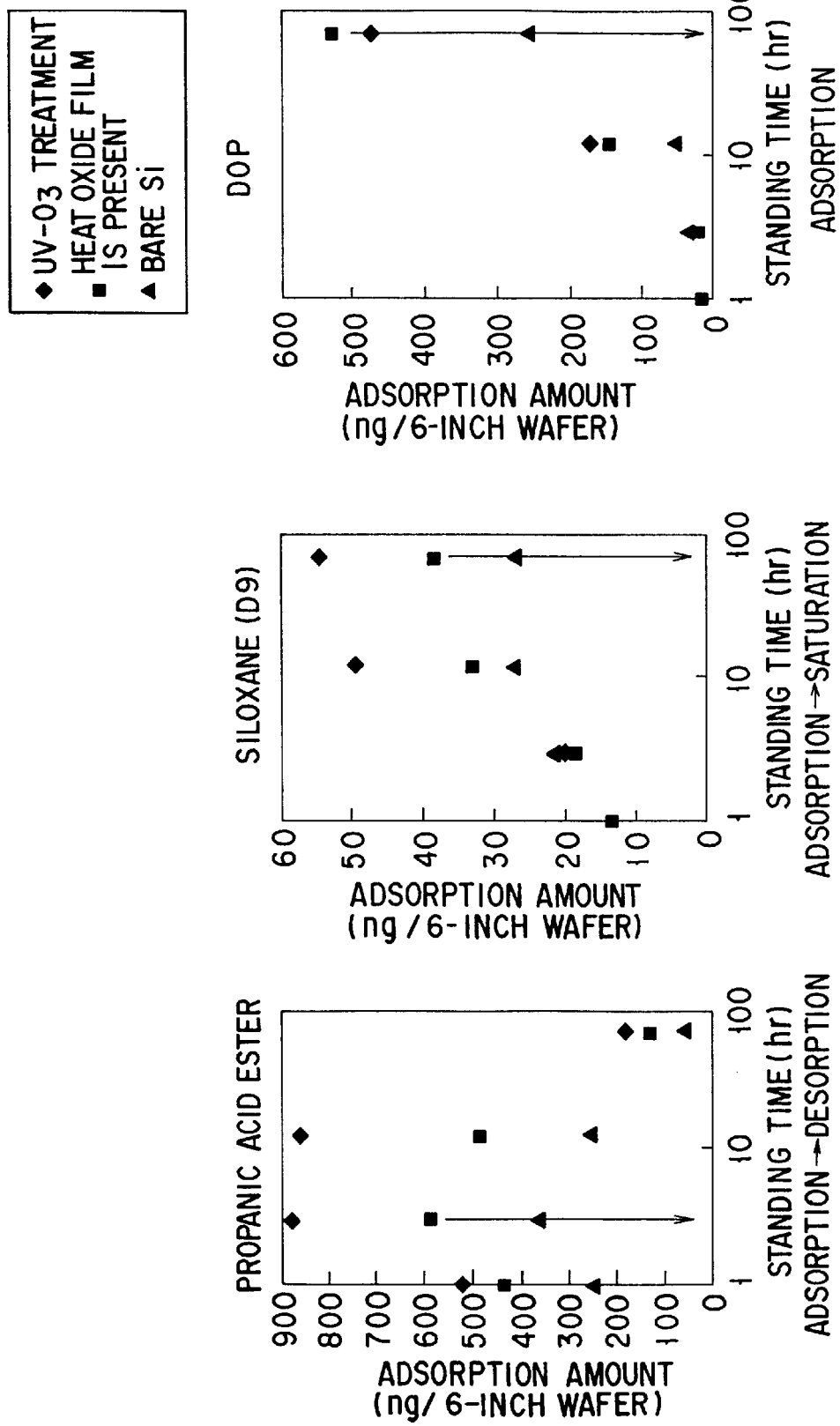

FIG. 3A is a graph illustrating the relationship between a time in which the substrate is let stand and the amount of propanic acid ester adsorbed, FIG. 3B is a graph illustrating the relationship between a time in which the substrate is let stand and the amount of siloxane adsorbed, and FIG. 3C is a graph illustrating the relationship between the time in which the substrate is let stand and the amount of DOP adsorbed.

Figure 4A:
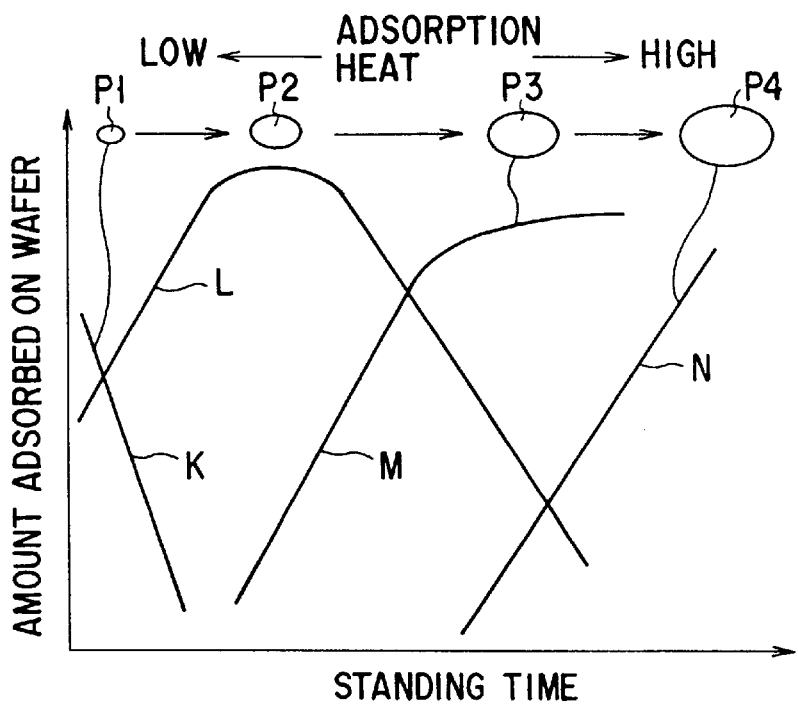
Figure 4B:
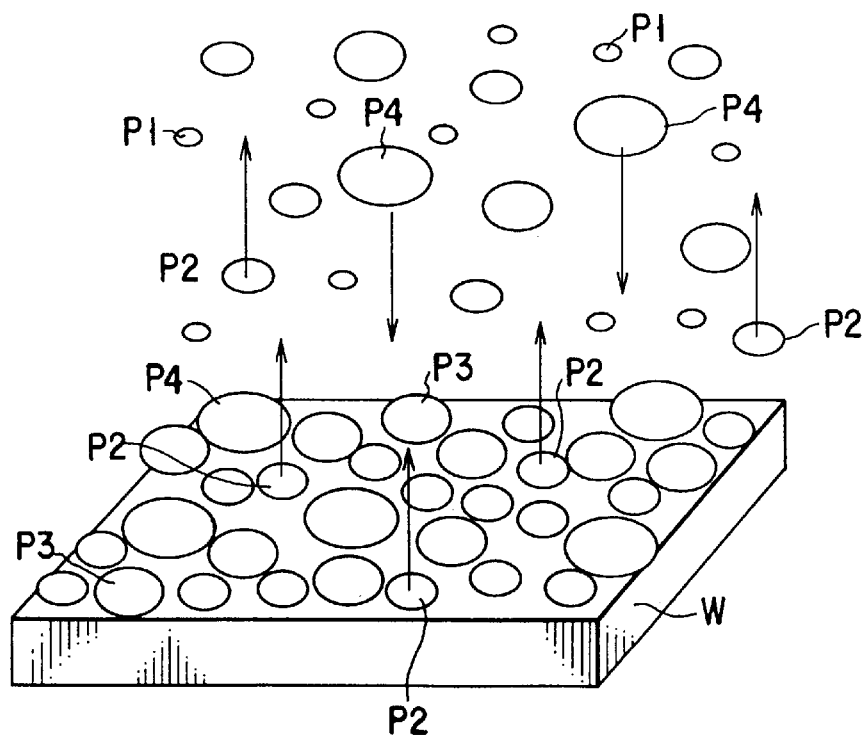

FIG. 4A is a characteristic diagram illustrating the time-dependency of the absorption or detachment of organic matters to or from a wafer, which differs from one type of organic matter to another, and FIG. 4B is a conceptual diagram illustrating the phenomenon of the adsorption and detachment of organic matter with respect to a wafer, which occurs depending upon the kind of organic matter.

Figure 5:
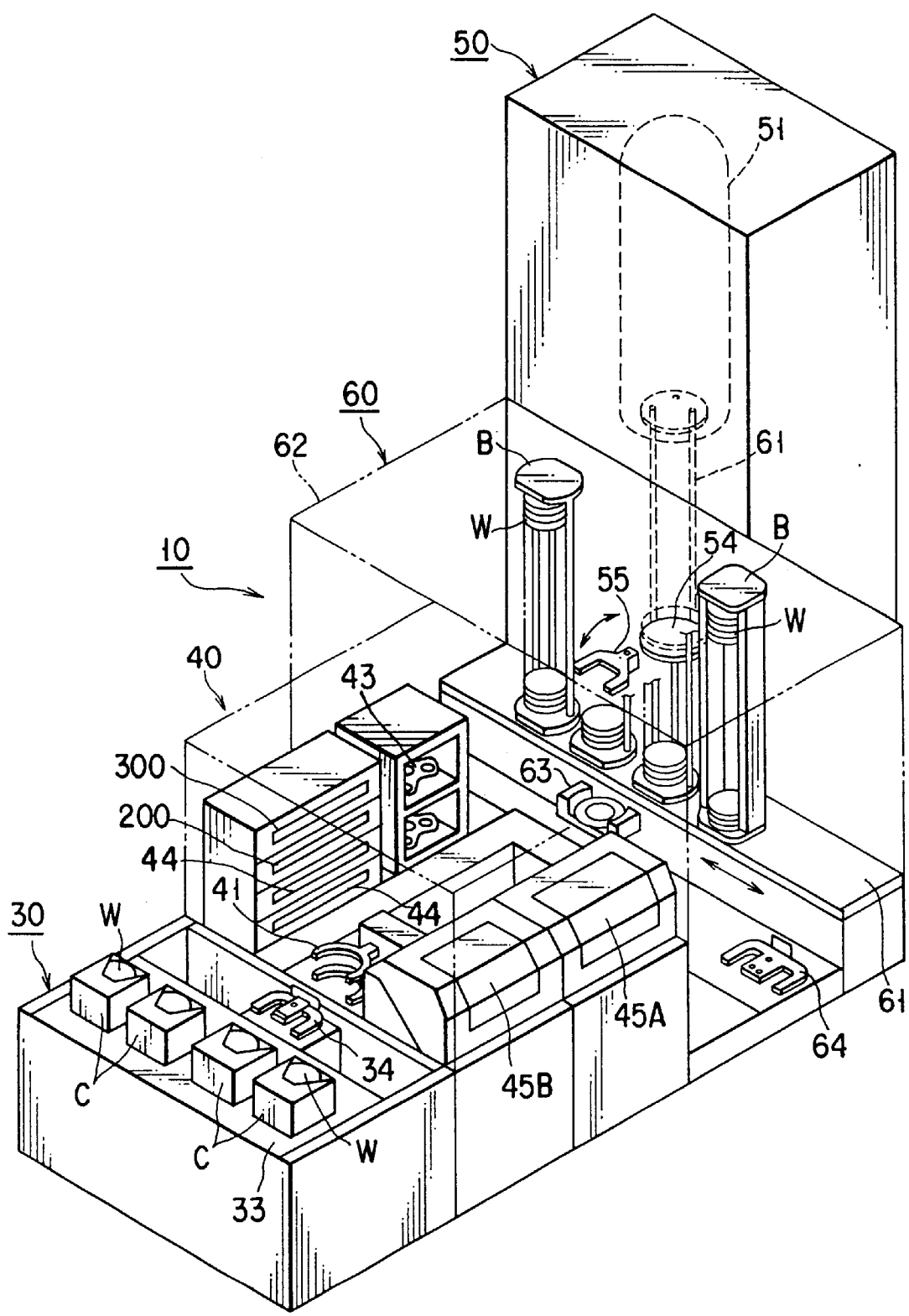

FIG. 5 is a schematic perspective view illustrating the entire cleaning/heat processing system.

Figure 6:
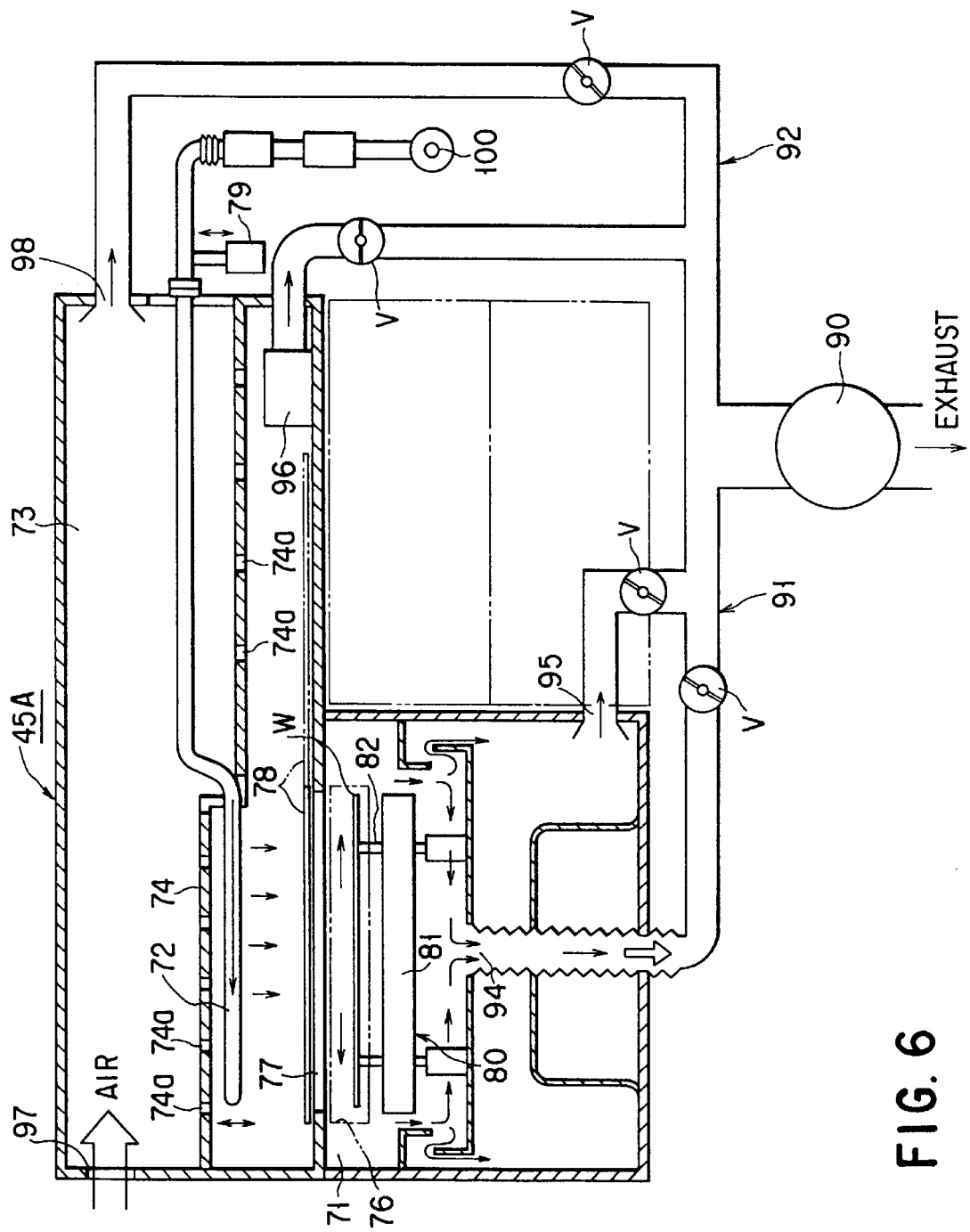

FIG. 6 is a cross section of an example of a dry type cleaning device (ultraviolet ray irradiation ozone cleaning device), which sees through the interior of the device.

Figure 7:
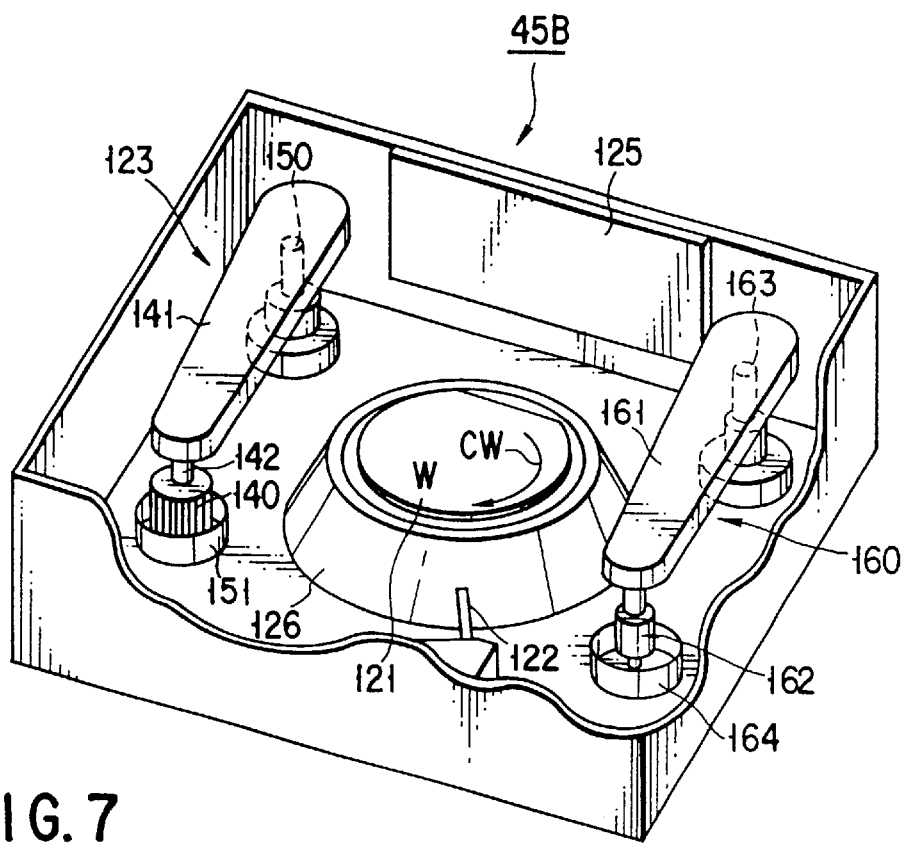

FIG. 7 is a perspective view of an example of a wet type cleaning device (brush scrubber device), which sees through the interior of the device.

Figure 8:
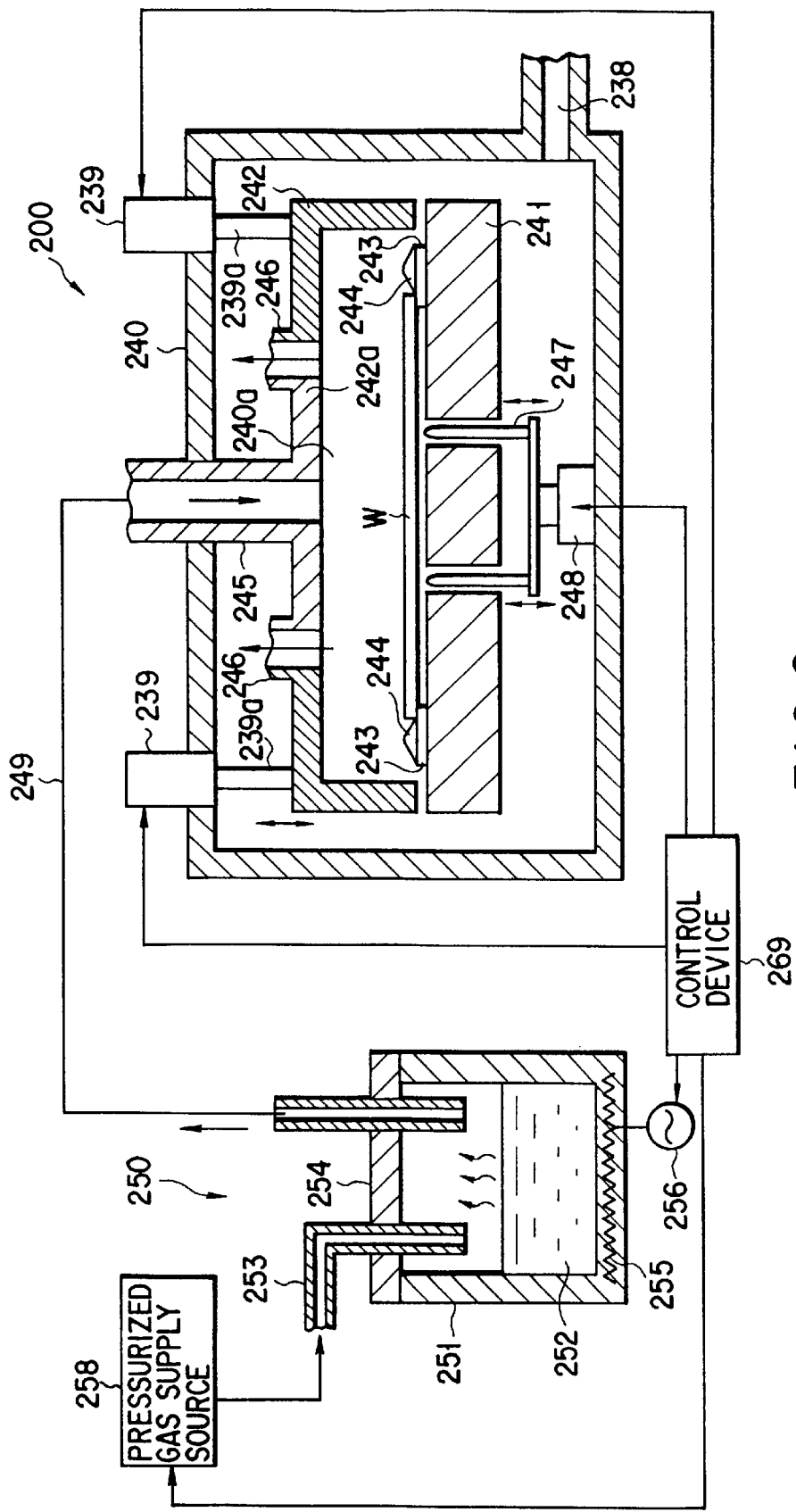

FIG. 8 is a block cross section showing a substrate processing device (, which processes the surface of a substrate while using a substance containing a hydroxy group) according an embodiment of the present invention.

Figure 9:
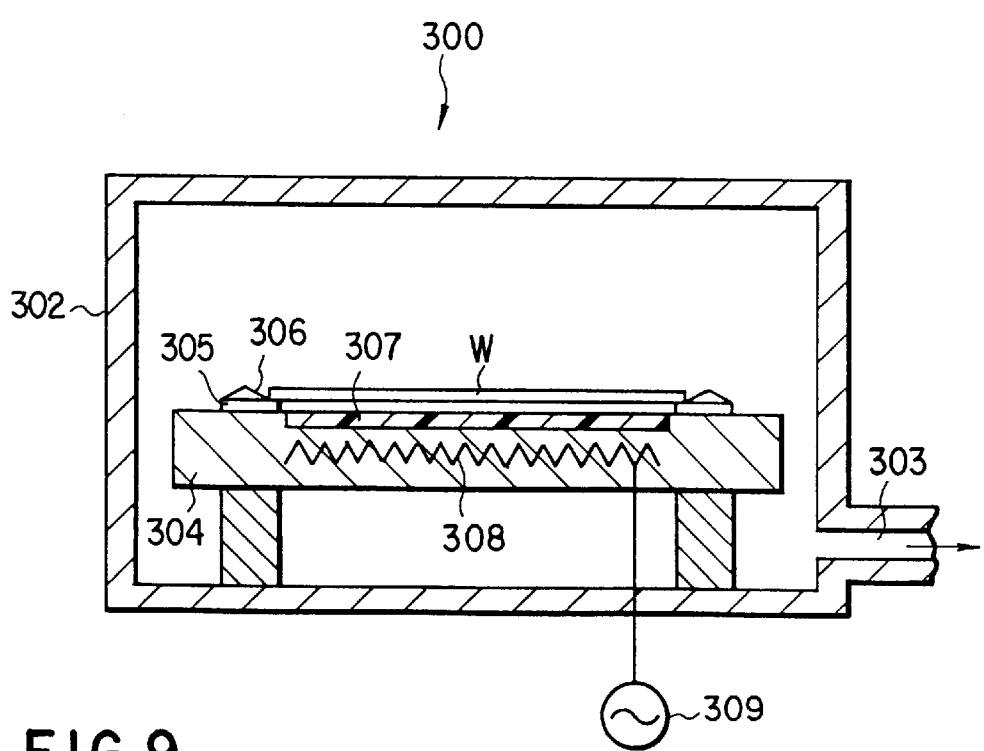

FIG. 9 is a block cross section showing a substrate processing device (, which processes the surface of a substrate while using a substance having a high adsorption heat) according another embodiment of the present invention.

Figure 10:
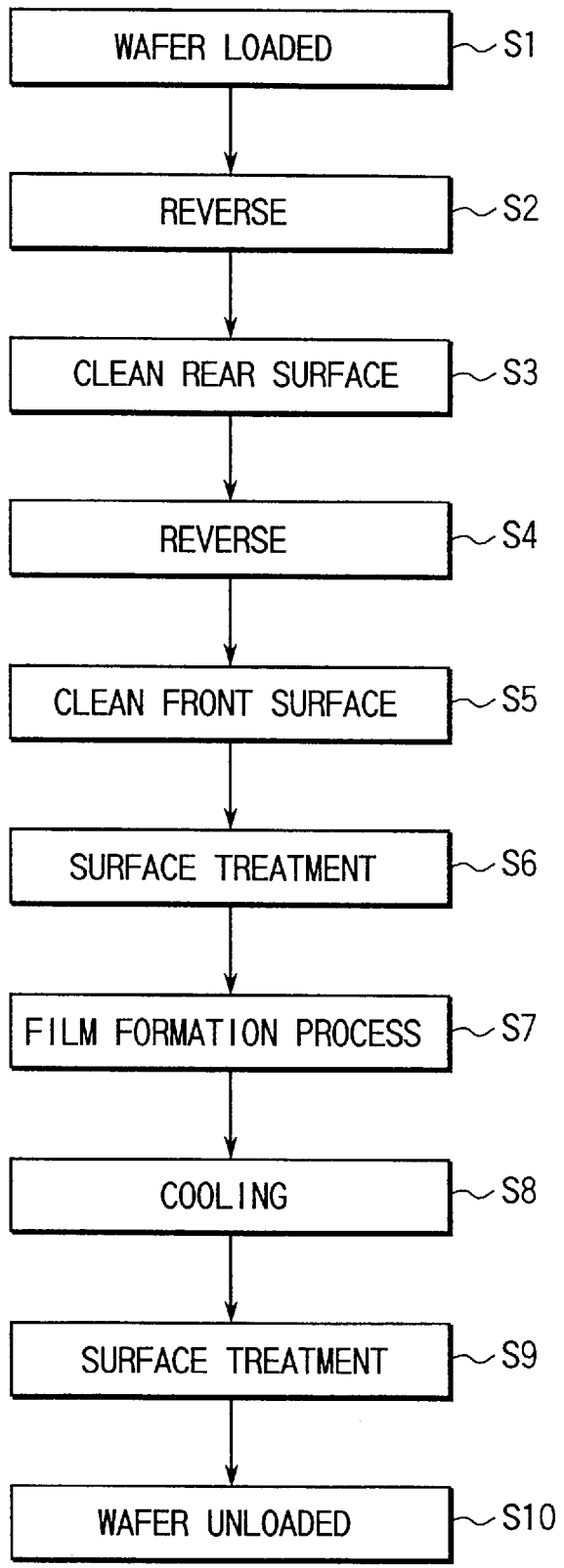

FIG. 10 is a flow chart illustrating a substrate processing method according to an embodiment of the present invention.

Figure 11:
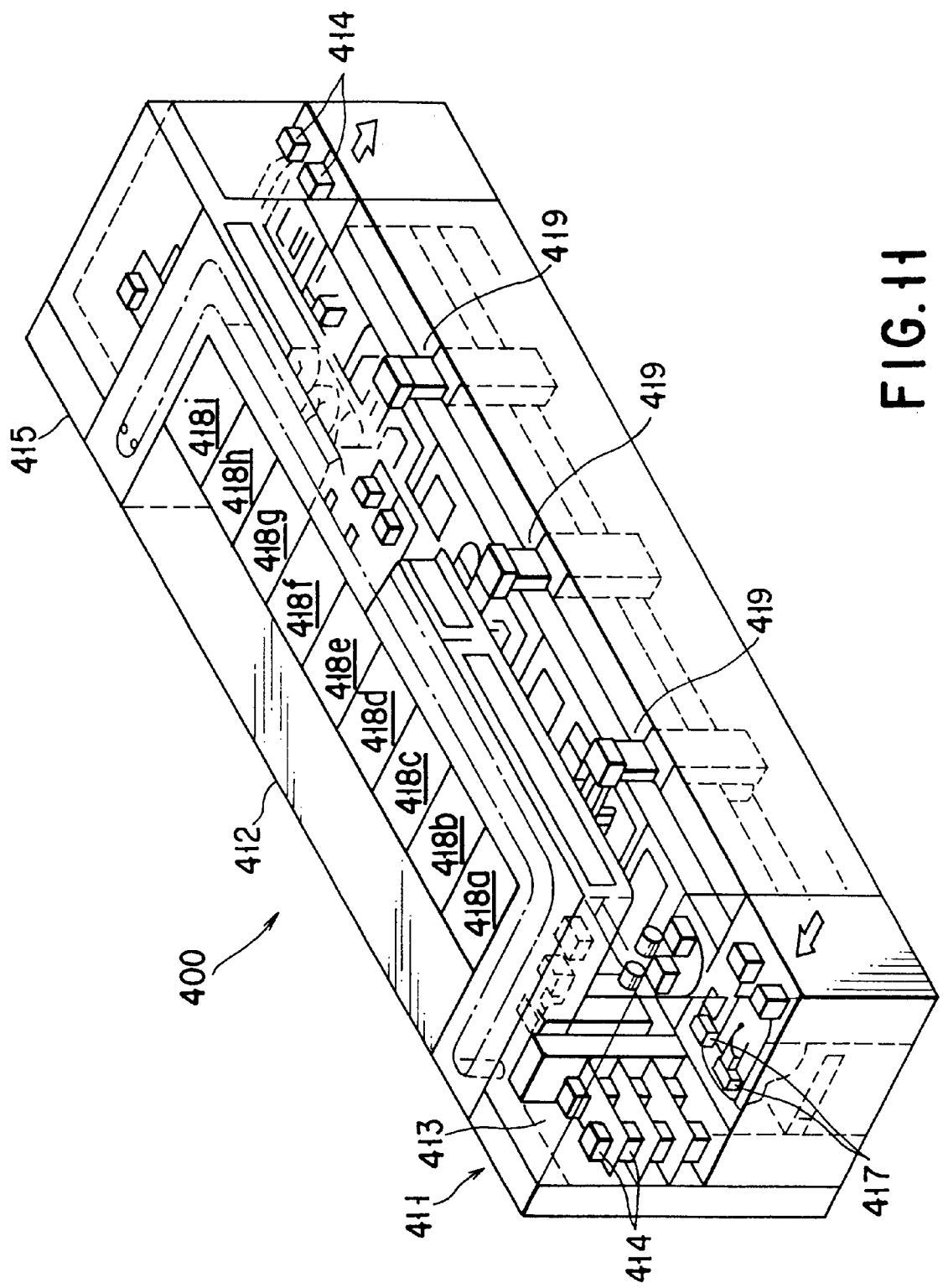

FIG. 11 is a perspective view briefly showing the entire cleaning and drying system.

Figure 12:
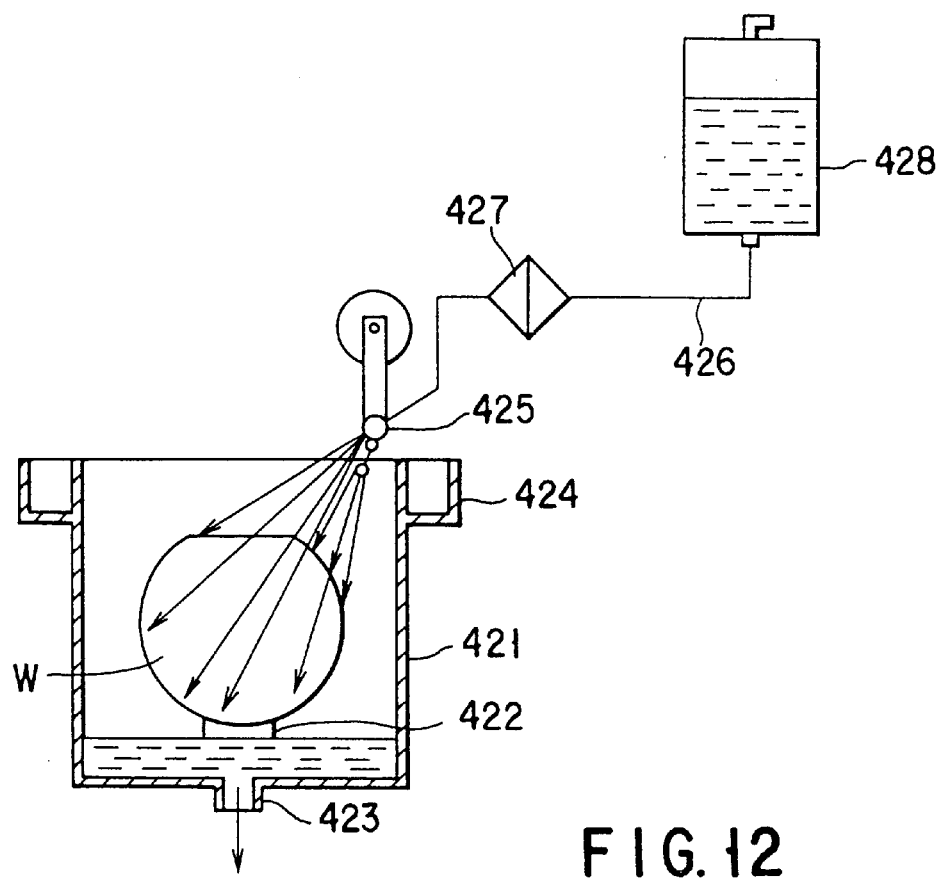

FIG. 12 is a schematic block diagram showing a cross section of a device used for a substrate processing method according to another embodiment.

Figure 13:
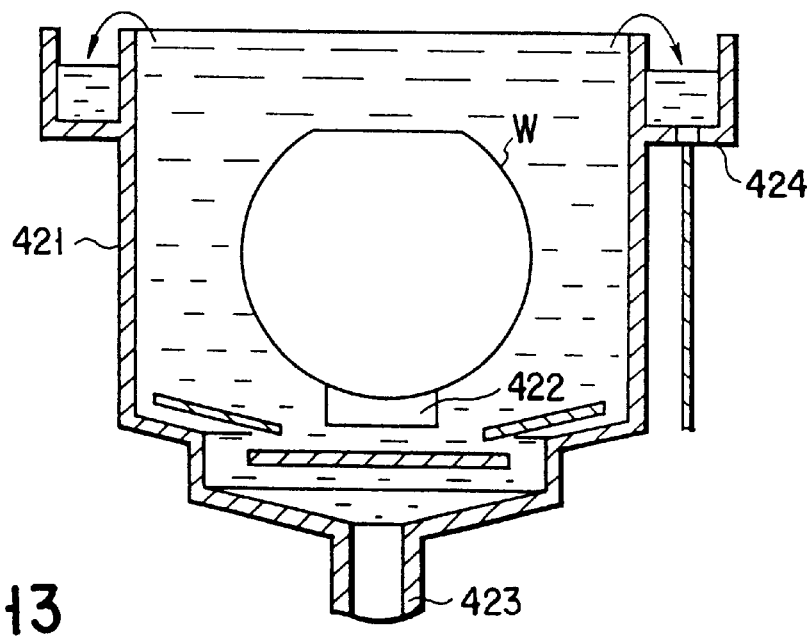

FIG. 13 is a diagram showing a cross section of a part of the device used for a substrate processing method according to another embodiment.

Figure 14:
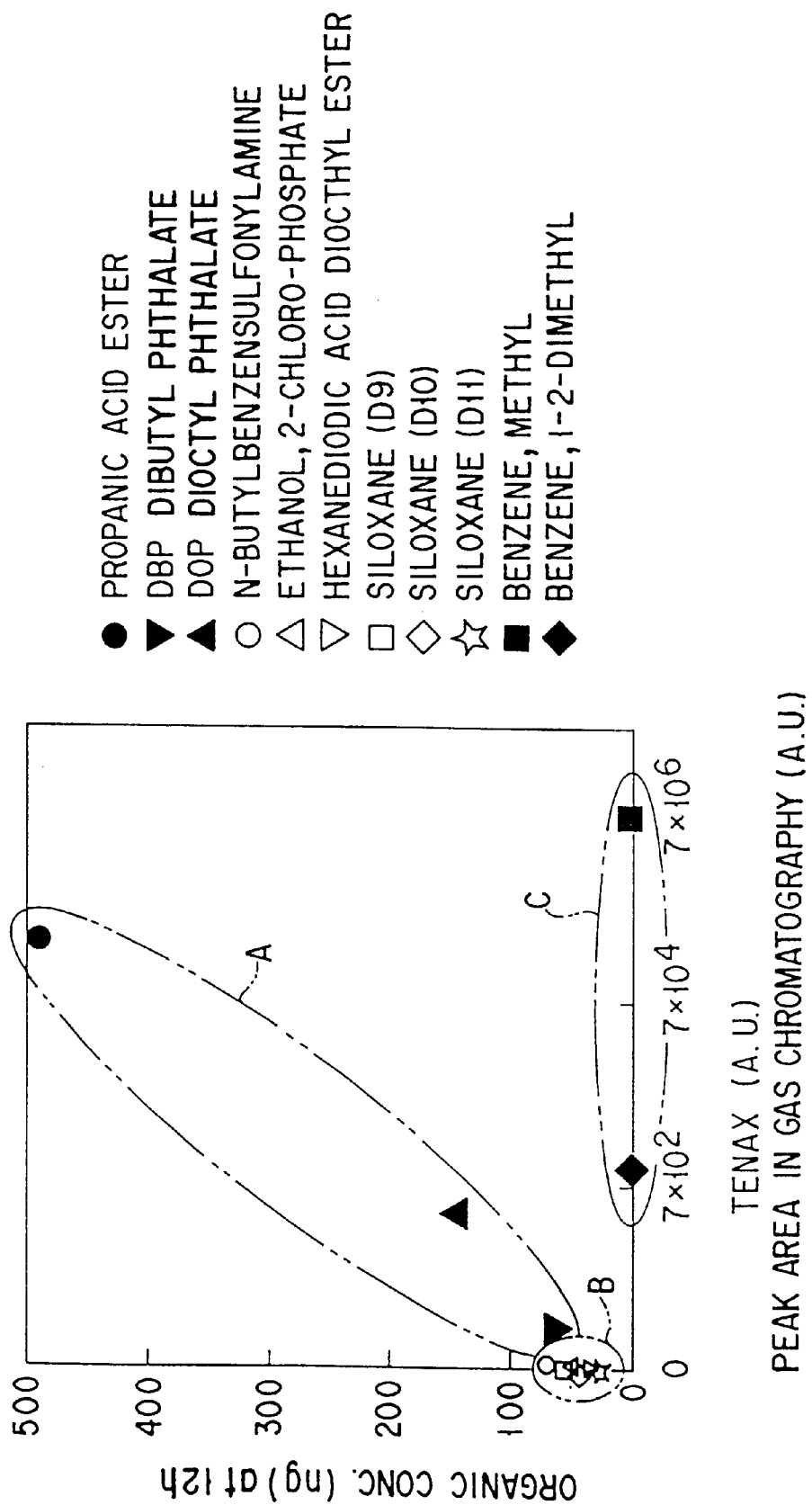

FIG. 14 is a characteristic diagram showing the relationship between the concentration in the atmosphere and the amount of the matter attached to the wafer surface, for various types of organic components by plotting result of the test on the diagram.

Figure 15:
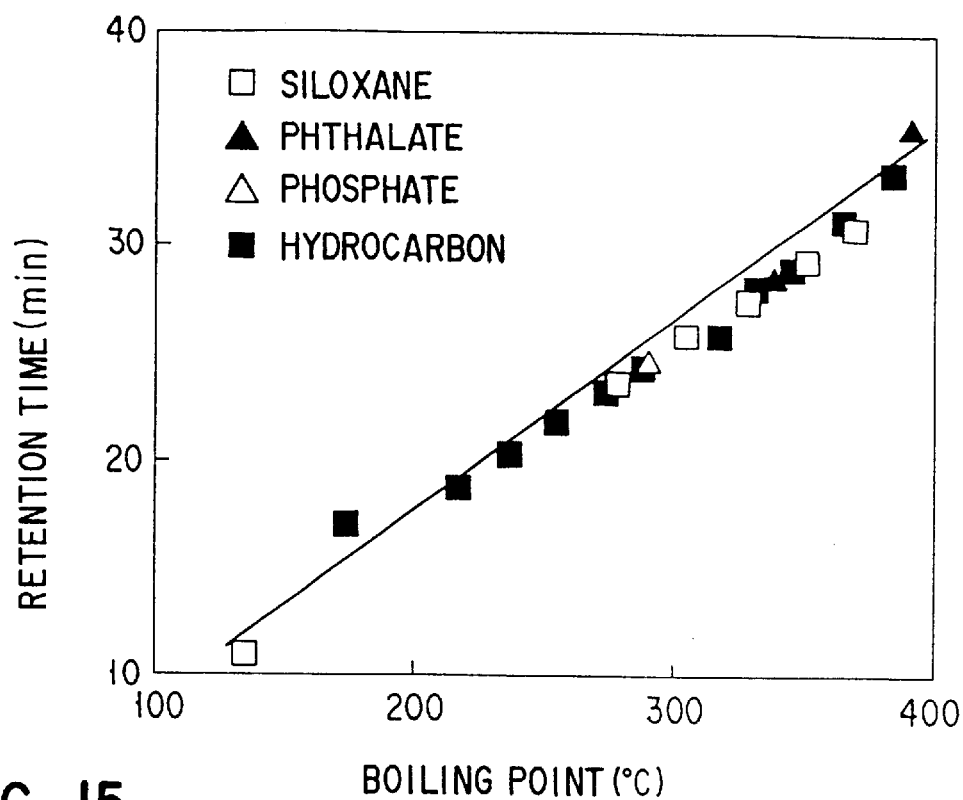

FIG. 15 is a characteristic diagram showing the relationship between the boiling point (° C.) and gas chromatography retention time (minute) for various types of organic components by plotting result of the test on the diagram.

Figure 16:
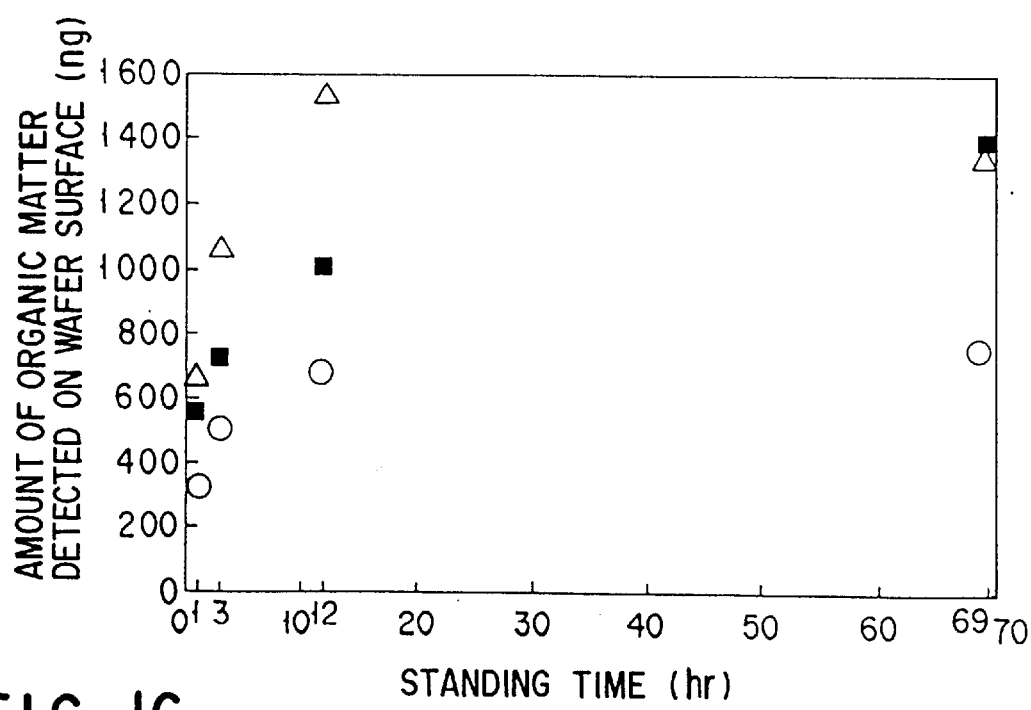

FIG. 16 is a characteristic diagram showing the relationship between the time for which the wafer is let stand (h) and the detected amount (ng) of organic matter attached to the surface of a 6-inch diameter wafer, for various types of surface states by plotting result of the test on the diagram.

Figure 17:
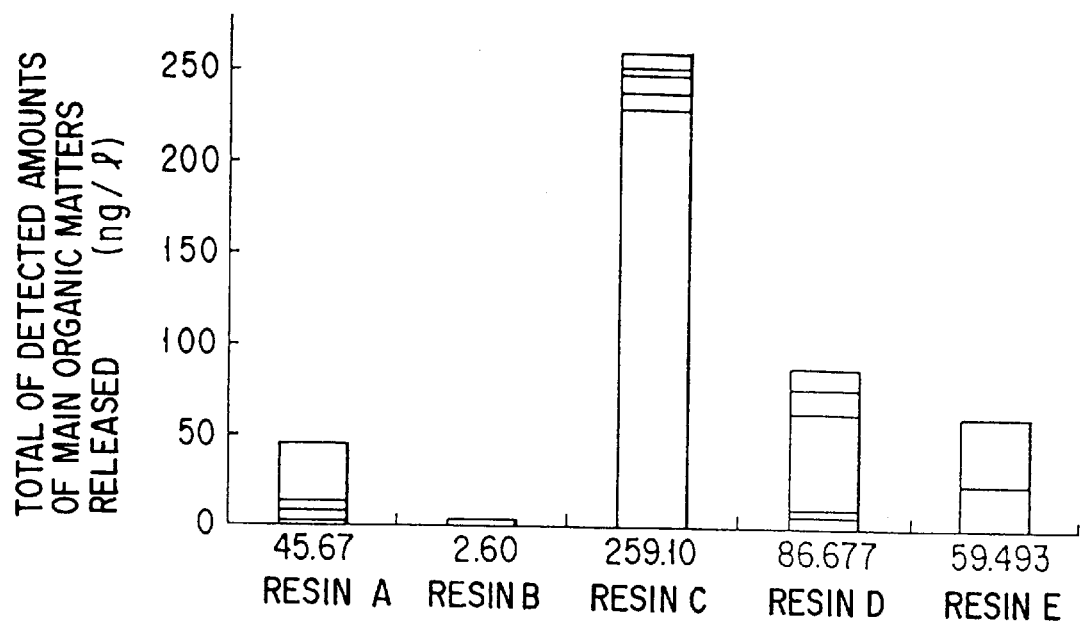

FIG. 17 is a graph illustrating the results of the measurement of the total of the detected amounts of the main organic matters (5 components) released from various types of resin materials.

Figure 18:
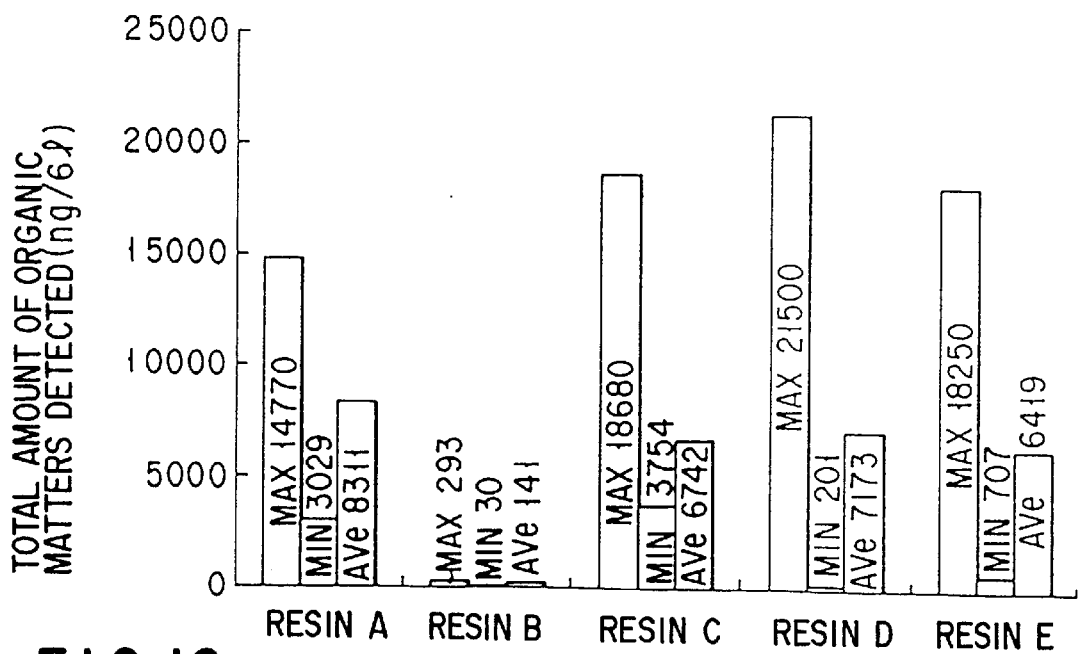

FIG. 18 is a graph showing the results of the. measurement of the total organic matter detection amount (maximum, minimum, average) obtained by totaling the amounts of organic matters released from various types of resin materials.

Figure 19:
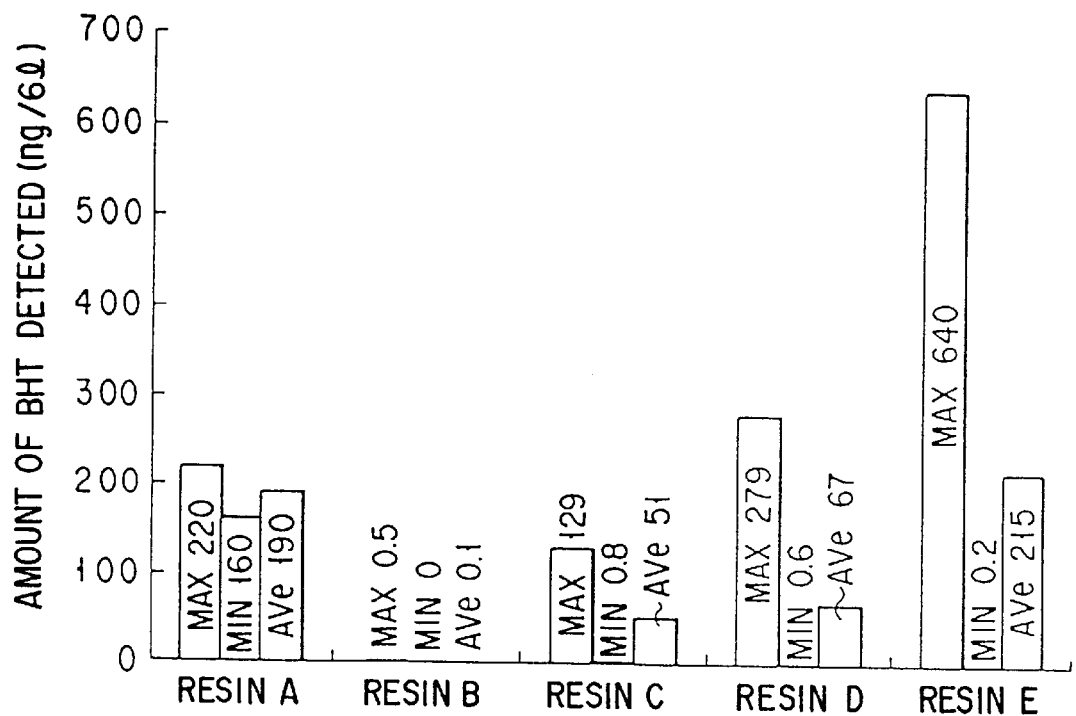

FIG. 19 is a graph showing the results of the measurement of the detection amount (maximum, minimum, average) of butylhydroxy toluene (BHT) released from various types of resin materials.

Figure 20:
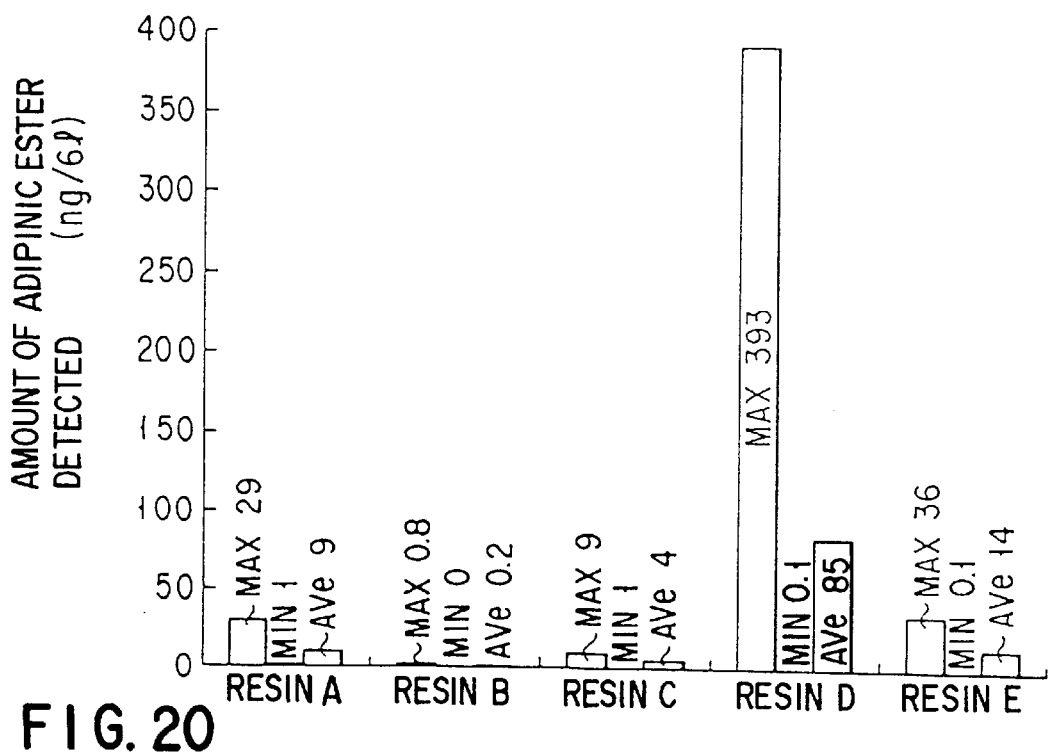

FIG. 20 is a graph showing the results of the measurement of the detection amount (maximum, minimum, average) of adipic acid ester released from various types of resin materials.

FIG. 21 is a graph showing the results of the measurement of the detection amount (maximum, minimum, average) of phthalic acid ester released from various types of resin materials.

FIG. 22 is a graph showing the results of the measurement of the detection amount (maximum, minimum, average) of phosphoric ester released from various types of resin materials.

FIG. 23 is a graph showing the results of the measurement of the detection amount (maximum, minimum, average) of siloxane released from various types of resin materials.

Figure 24:
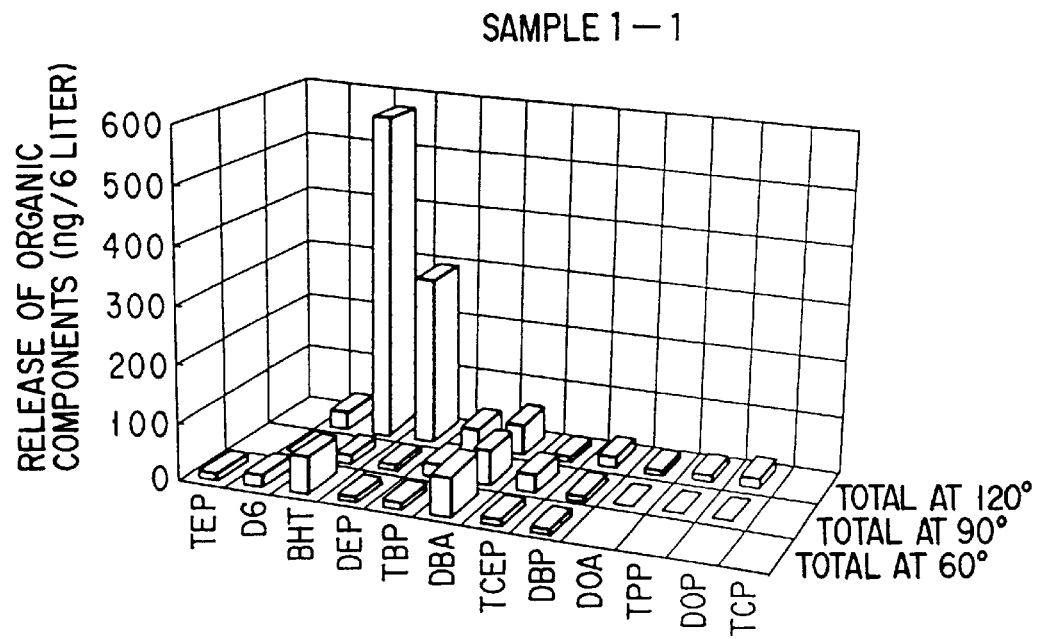

FIG. 24 is a graph showing the results of the measurement of the release amount of various types of organic components released from a resin part sample 1-1, with respect to various temperatures.

Figure 25:
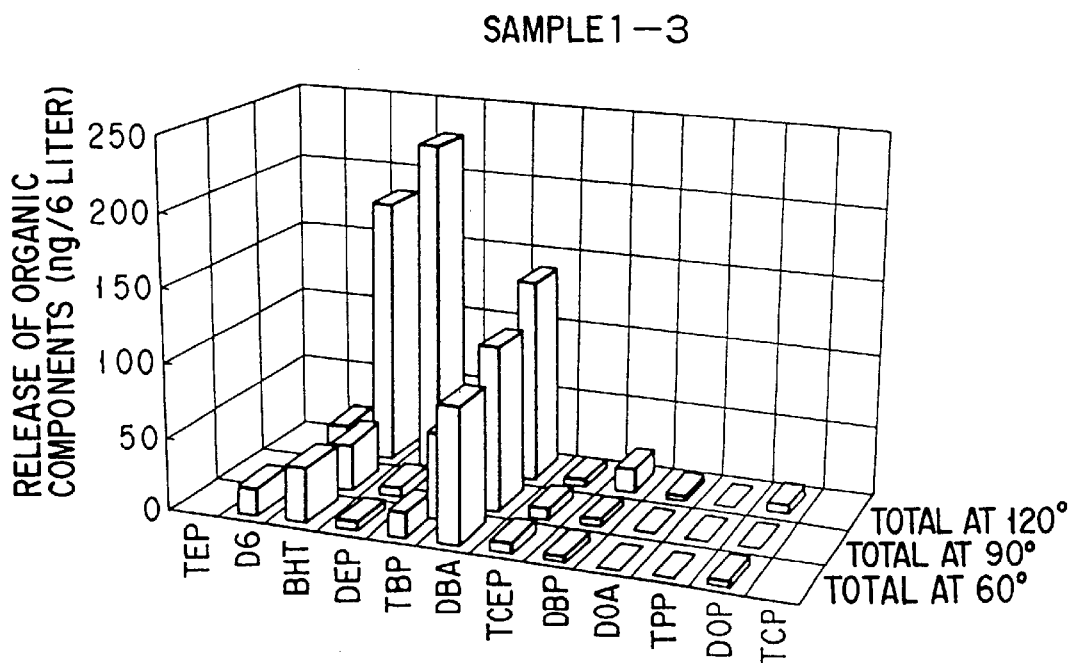

FIG. 25 is a graph showing the results of the measurement of the release amount of various types of organic components released from a resin part sample 1-3, with respect to various temperatures.

Figure 26:
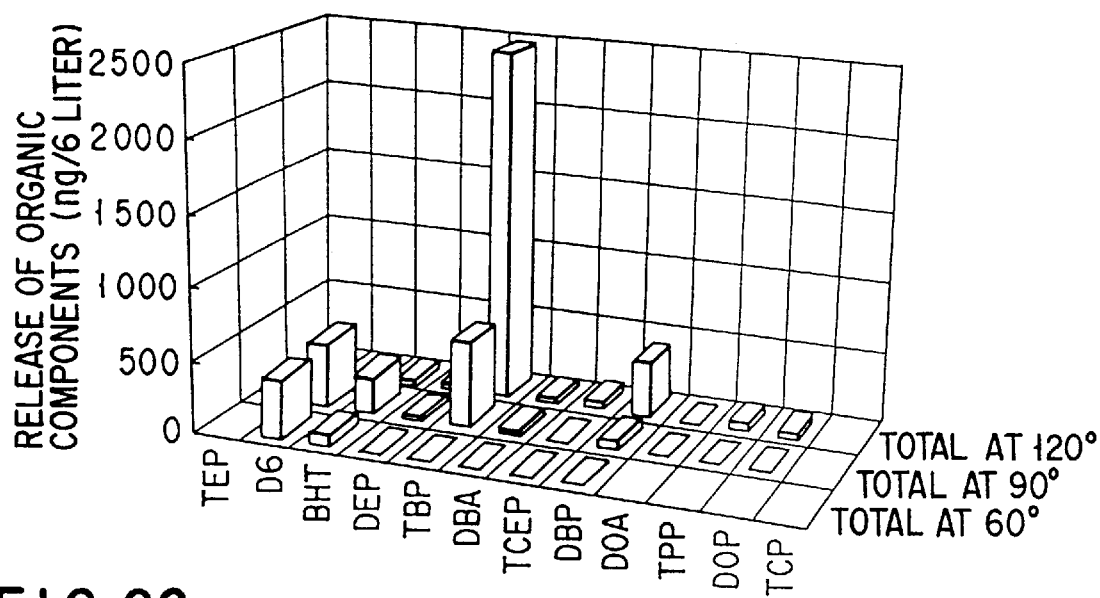

FIG. 26 is a graph showing the results of the measurement of the release amount of various types of organic components released from a resin part sample 9-3, with respect to various temperatures.

Figure 27:
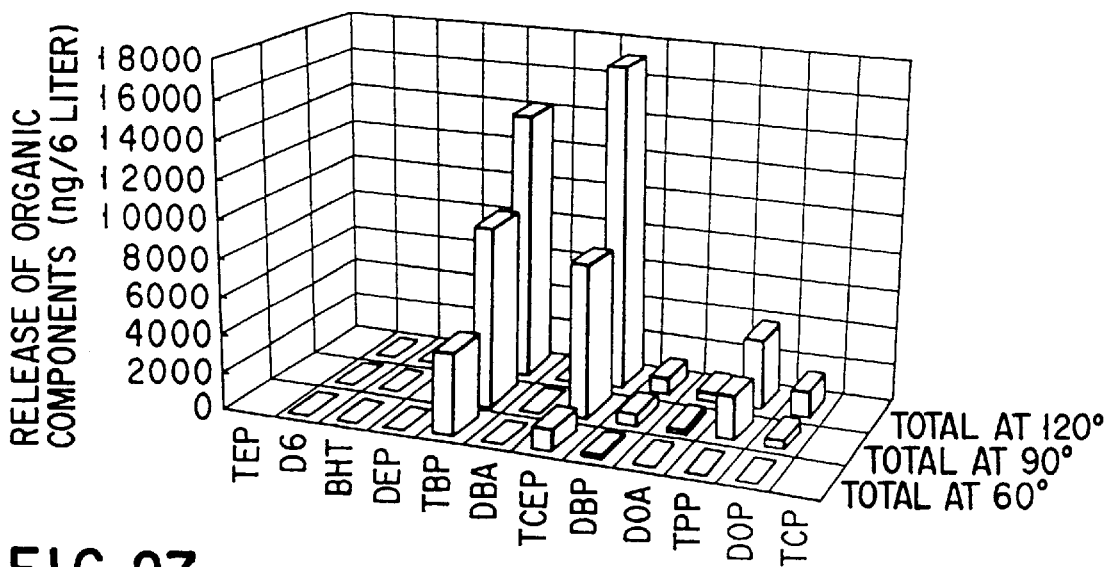

FIG. 27 is a graph showing the results of the measurement of the release amount of various types of organic components released from a resin part sample 14-15, with respect to various temperatures;

5. BEST MODE OF CARRYING OUT THE INVENTION

Embodiments of the present invention will now be described in detail.

First, the inventors of the present invention conducted the following researches as to find out the relationship between the concentration of organic matter in a processing atmosphere (for example, clean room) and the amount of organic matter adsorbed on a substrate (especially, a wafer), what sort of organic matters are easily adsorbed on the surface of a substrate, whether or not the adsorption amount differs depending upon the surface state of the wafer, and the like.

1) Regarding the Behavior of the Organic Matter with regard to the surface of the substrate In this research, the processing environment was set in a clean room, a semiconductor wafer was used as a substrate. The clean room of the subject was an entire surface downflow type of about 7 years old, of class 10 (FFU (fan filter unit) mode having a floor area of 289 m$^2$ and the number of circulation of 215 times/hour).

It is known that in the case where a wafer is exposed to the clean room, siloxane, oxidization inhibitors, plasticizers and the like, which exist at relatively low concentrations, are selectively adsorbed on the surface of a wafer, rather than toluene and low-molecular alcohols, which exist at high concentrations in the atmosphere. Conventionally, there have been reports which focus on functional groups (C=O group, OH group and the like) of organic materials, and indicate its selective adsorption behavior resulting due to the compatibility with respect to the polarity on the surface of the wafer. However, in any of these reports, the components and concentrations in the atmosphere were not clear or the results of the evaluation made were obtained with regard to systems each having a very small amount of atmospheric components. Thus, these reports were connected to systems very much different to the actual clean room atmosphere.

2) Regarding the Mechanism of Selectively Adsorbing a Particular Organic Material onto the Surface of a Substrate Here, the time dependency of the organic contamination onto the surface of a wafer exposed to an actual clean room was evaluated, in order to estimate the mechanism of selectively adsorbing a specific organic material onto the surface of the wafer in a multi-components system. The wafer sample evaluated here was of a 6-inch p-type Si (100) wafer prepared by the growth by the Czochralski method, and having a resistance value of 10 Ω·cm. Further, in order to grasp the difference in the surface state of wafer, a type which is terminated with hydrogen (processed for 5 minutes with a 1% HF aqueous solution) was assigned as sample I, a type on which a heat oxide film was formed (processed by wet oxidation and processed with 1% DHF for 5 minutes, a thickness of 100 nm) was assigned as sample II and a type cleaned with ultraviolet ray irradiated ozone (UV—$O_3$) was assigned as sample III. These three samples I, II and III were let stand to be exposed at the same time in the same place.

For the analysis of the contamination of the surface of the wafer with organic materials, a heat desorption (Product of GL Science)—GC/MS (gas chromatography/mass spectrometry, product of HITACHI Manufacture Co.) shown in FIGS. 1A and 1B were used. More specifically, a wafer W contained in a carrier 2 was exposed to clean air supplied into a clean room supplied via a filter 1, and the wafer W was placed in an oven 4 equipped with a heater 3, and heated up to about 315° C. Thus, the organic matter attached to the wafer W was gasified, and the gasified organic matter was sent to a trap 5 with He gas serving as a carrier gas so as to remove the moisture, thereby being concentrated. Then, the concentrated organic matter was heated, and after the organic matter separated from the trap 5 was concentrated by cooling it with liquid nitrogen, the organic matter is sent to a GC/MS6.

In order for the determination of a component detected, a reference solution (hexadecan) of a known concentration was supplied dropwise to the center portion of the wafer, and thus the analysis was carried out in the above-described manner. With the peaks thus obtained, an analytical curve was formed. It should be noted that the lower limit of the detection of the analyzer was 10 ng/6-inch wafer (converted with regard to hexadecan).

Figure 2B:
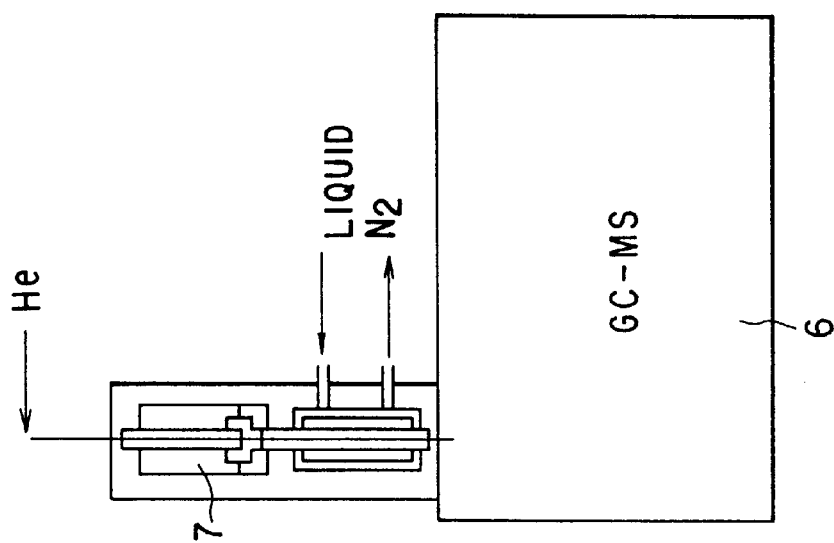
FIG. 2B is a schematic diagram briefly showing a device for detecting and measuring an organic matter attached to a surface of a wafer.
Figure 2A:
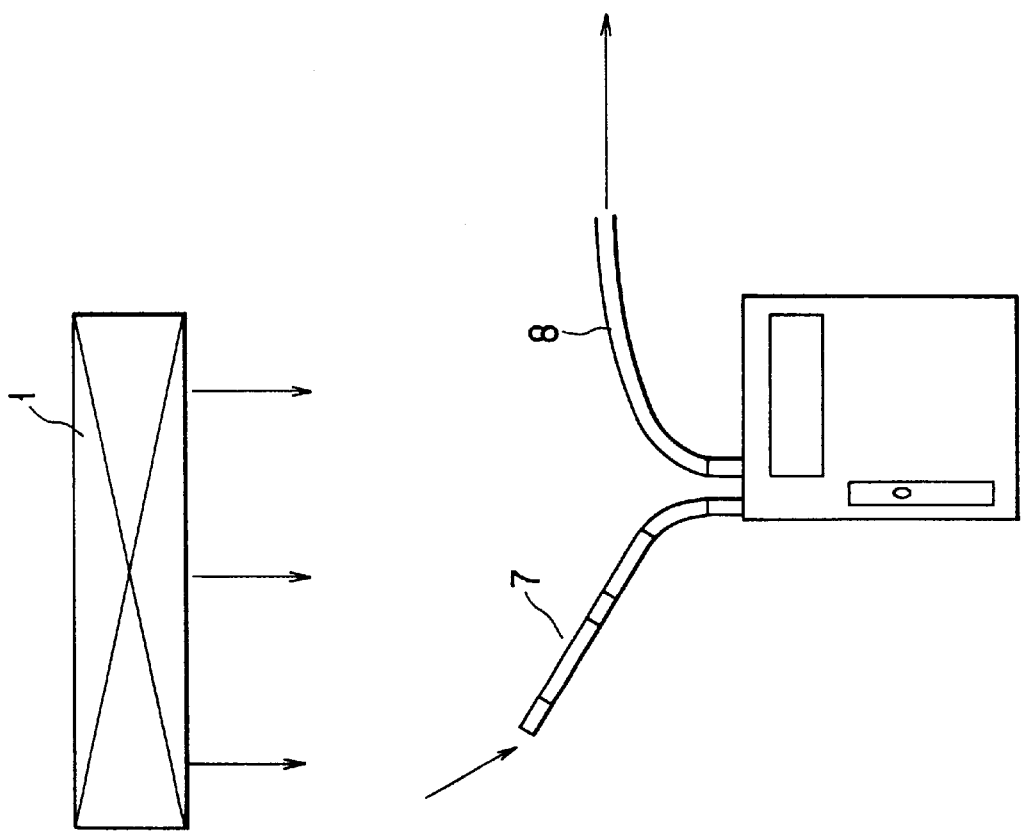
FIG. 2A is a schematic diagram showing a device for capturing organic matters in the atmosphere of a clean room.

The organic matter within the clean room atmosphere is analyzed in terms of its properties and quantity in the following manner, as shown in FIGS. 2A and 2B. That is, the clean air within the clean room is permitted to flow through a sample tube 7 filled with a collector, TENAX (porous beads of GL Science Co.) for a certain period of time (for example, at a flow rate of 250 cc/minutes for 60 minutes), and the sample tube 7 is connected to the GC/MS6. It should be noted that reference numeral 8 in FIG. 2A denotes an exhaustion tube.

3) Regarding the Adsorbing Properties of Various Types of Organic Materials

The relationship between the organic concentration within the clean room atmosphere and the amount of organic matter adsorbed onto a heat oxide film wafer (a wafer sample on which a heat oxide film was formed) which was let stand for 10 hours in the atmosphere, was examined by carrying out the above-described measurement. The results were summarized in FIG. 14. FIG. 14 is a graph illustrating the results of the examination of the relationship between these, taking a lateral axis for a peak area (A.U.) obtained in the analysis of the gas which has passed through TENAX (the collector of porous beads), and an ordinate for the amount (ng) of organic matter adsorbed onto the surface of a substrate. As the value on the lateral axis increases, the substance is present more in the atmosphere, and as the value on the ordinate increases, the substance is adsorbed more on the surface of the wafer. It should be noted that the amount of organic matter adsorbed was obtained by dividing the amount of organic matter adsorbed by the collector (TENAX) after the gas was let to flow for 12 hours by an area (cm$^2$) of a 6-inch silicon wafer. The "TENAX" is an aggregate of a great number of porous beads having a polarity. All the results were obtained by the measurements carried out under conditions of room temperature and atmospheric pressure.

In FIG. 14, the black circle represents propanic acid ester, the inverse black triangle represents dibutyl phthalate (DBP), the black triangle represents dioctyl phthalate (DOP), the white circle represents N-butylbenzenesulfonylamine, the white triangle represents ethanol 1,2-chloro-phosphate, the inverse white triangle represents adipic dioctylester, the white square represents cyclic siloxane (D9) having 9 silicon atoms, the white diamond represents cyclic siloxane (D10) having 10 silicon atoms, the white star represents cyclic siloxane (D11) having 11 silicon atoms, the black square represents benzene methyl, and the black diamond represents benzene 1,2-dimethyl. The results thus obtained indicated that these organic compounds are divided into three groups of A, B and C. That is, the group A is for those of organic matters (such as DOP and DBP) whose concentrations detected on the surface of the wafer, are in accordance with the concentrations of these in the atmosphere, the group B is for those of organic matters (for example, siloxane) which are detected on the surface of the wafer, although their concentrations in the atmosphere are low, and the group C is for those of organic matters (such as toluene and xylene) which cannot be detected on the surface of the wafer, although their concentrations in the atmosphere are high. As shown, with regard to propanic acid ester, DBP, DOP and the like, which belong to the group A, the amount of the material adsorbed on the surface of the wafer increased in substantially proportional to the concentration in the atmosphere. However, N-butylbenzenesulfonylamine, ethanol1,2-chloro-phosphate, adipic dioctylester, and cyclic siloxanes having 9 to 11 silicon atoms (D9, D10, D11), which belong to the group B, were detected as. adsorbed matters on the surface of the wafer although they were not substantially detected within the atmosphere. This indicates that the organic compounds which belong to the group B each have a high adsorption property with respect to the surface of the wafer.

By contrast, methyl benzene and benzene 1,2-dimethyl, which belong to the group C were not at all detected on the surface of the wafer although the concentrations within the atmosphere were high. This indicates that the organic compounds which belong to the group C were not at all adsorbed onto the surface of the wafer.

As is clear from the above, it has been clarified that the cyclic siloxanes of the group B can be very easily adsorbed onto the surface (which is hydrophilic) of a silicon wafer, whereas the hydrocarbon-based benzene compounds of the group C can hardly be adsorbed on the surface (which is hydrophilic) of a silicon wafer.

Thus, the behavior of the adsorption of organic matters onto the surface of a wafer can be categorized into three types, and the time dependency of the adsorption of organic matter onto the surface of wafer was examined for various types of wafers. Samples of evaluation, used were three types, namely a silicon wafer (sample A) having an ultraviolet ray-irradiated ozone cleaning surface (UV—$O_3$ clean surface), a silicon wafer (sample B) on which a thermal oxidation film (Th—$SiO_2$ film) was formed, and a silicon wafer (sample C) having a surface which had not been processed (that is, bare Si surface). These three types of samples A, B and C were let stand for 1 hour, 3 hours, 12 hours and 69 hours, and the amount of organic matter adhered on the surface was measured for each sample. The results are respectively shown in FIGS. 3A, 3B and 3C. In the figure, the black diamond indicates the result of the sample A, the black square indicates the result of the sample B and the black triangle indicates the result of the sample C. It was found from these results that the organic matter adsorption amount would depend upon the state of the surface of the wafer. More specifically, it was found that the organic matters would be adsorbed more easily onto the sample A (UV—$O_3$ clean surface) and the sample C (Th—$SiO_2$ film surface) each having a hydrophilic surface than onto the sample C having a hydrophobic surface (bare Si surface). However, there was no difference observed in terms of component among these samples.

Further, regardless of the state of the wafer surface, the time-dependency of the adsorption of organic matter can be divided mainly into three. More specifically, they can be divided into those organic matters of a type in which the adsorption amount became maximum within a short period of time (when let stand for 3 hours), and after that, the desorption behavior was exhibited (propanic acid ester and the like) as shown in FIG. 3A, those of a type in which the saturation of the adsorption amount was observed after they were let stand for 10 hours as shown in FIG. 3B (siloxane (D9) and the like), and those of a type in which the adsorption occurred acceleratingly after 10 hours and kept on adsorbing even after being let stand for 64 hours (DOP and the like) as shown in FIG. 3C.

As described above, it was found that the time at which the behavior makes a transition from the adsorption to the desorption differs from one organic matter to another. Therefore, it becomes possible to grasp the order from the adsorption to the desorption for all the organic matters by comparing the organic matters in terms of the standing time of the organic matter when the amount of the adsorption to the surface of the wafer becomes maximum (the portion indicated by arrow in each of FIGS. 3A, 3B and 3C).

Next, the relationship between the standing time when the amount of adsorption on the wafer surface becomes maximum, and the retention time of the gas chromatography was examined. It was found that as the adsorption heat (kJ/mol) of an organic matter with respect to the wafer, is higher, it becomes more easy that the organic matter is detected on the wafer which has been let stand for a long time. It should be noted that the adsorption heat can be calculated from the retention time of GC/MS.

Therefore, in a multi-component system such as clean room atmosphere in which various organic matters are mixedly present, the adsorption mechanism of organic matters with respect to the wafer surface can be modeled as shown in FIGS. 4A and 4B. As indicated by the characteristic curve K shown in FIG. 4A, an organic matter P1 having the minimum adsorption heat amount is desorbed from the surface of the substrate in a short period of time. Another organic matter P2 having a slightly lower adsorption heat amount exhibits a behavior indicated by the characteristical curve L shown in FIG. 4A. Still another organic matter P3 having a slightly higher adsorption heat amount exhibits a behavior indicated by the characteristic curve M shown in FIG. 4A. Still another organic matter P4 having the maximum adsorption heat amount exhibits a behavior indicated by the characteristic curve N shown in FIG. 4A. That is, as shown in FIG. 4B, the replacement occurs among the organic matters P1 to P4, and as the standing time becomes longer, it is likely that the organic matters P3 and P4 having relatively high adsorption heats remain to be desorbed on the wafer W in large amount.

Since the organic matters P3 and P4 having high adsorption heats remain on the substrate W after being let stand for a long period of time, in the present invention, the organic matters P3 and P4 having high adsorption heats are in advance made adsorbed on a substrate W in order to inhibit the adsorption of non-volatile organic matters P1 and P2 onto the substrate W, which are considered to be harmful in the formation of a film in a process atmosphere.

With regard to the state of the surface of a substrate, when the process is carried out with, for example, an HF solution or the like, the surface of the substrate becomes hydrophobic and the adsorption of organic matters can be inhibited to a certain degree. In the present invention, in order to prevent the adsorption of non-volatile organic matters more effectively, the surface of the substrate is covered with a substance having a hydroxy group which is compatible with the hydrophobic surface. In this manner, the adsorption of non-volatile organic matters can be certainly prevented with a substance having a hydroxy group.

For the present invention, examples of the substrate are semiconductor wafers, and glass substrates. Further, in the present invention, the film formation process means, for example, the formation of a gate insulation film, a gate electrode film, a dielectric film of a capacitor, and a wiring metal film. Further, the expression "when the film formation process is carried out" includes before and after the film formation process and during the formation process. For example, when the process of the present invention (that is, the process with a material having a high adsorption heat or the process with a substance containing a hydroxy group) is carried out, the deterioration of the withstand voltage, the lowering of the reliability and the like can be prevented. Thus, the delay of the formation of a film, or the like can be prevented by carrying out the process of the present invention prior to the formation of a dielectric film of a capacitor. It should be noted that the process of the present invention should preferably be performed after the cleaning step carried out prior to the film formation, or after the formation of an underlying film.

In the present invention, the surface process which is carried out with use of a substance having a high adsorption heat with respect to the substance, and the surface process which is carried out with use of substance containing a hydroxy group or a ketone group mean that a substrate is exposed to a substance having a high adsorption heat with respect to the substrate, or to a substance containing a hydroxy group or a ketone group, or a substrate is immersed in such a substance, or placed in an atmosphere of such a substance.

The substance having a high adsorption heat with respect to the substrate means a gaseous organic matter (non-volatile organic matter) which is considered to be harmful for the film forming process, for example, an organic matter having a adsorption heat with regard to the substrate, higher than that of DOP (dioctyl phthalate) or the like. Further, examples of the substance containing a hydroxy group, are isopropyl alcohol, 2-ethylhexanol, methyl alcohol, ethyl alcohol, and examples the substance containing a ketone group, are acetone and methyl ethyl ketone.

It is preferable that the substance having a high adsorption heat or the substance containing a hydroxy group or a ketone group, before it is loaded in the heat processing furnace in the film formation step, should be vanished (removed) from the substrate by decomposing or evaporating (vaporizing) it with the heat (300° C. or higher) within the furnace. Usually, these substances are removed when they are loaded to the heat processing furnace in the film formation step; however it is possible that the process for evaporating these substances is carried out prior to the film formation step. When a substance having a high adsorption heat is used, it is possible to use a method of removing such an organic matter by the UV—$O_3$ process.

As the surface processing substance, an aliphatic hydrocarbon is preferable, but an aromatic hydrocarbon is not preferable. The former does not have a substantial effect on the quality of the film since it decomposes in the film formation step and vanishes from the surface of the substrate, whereas the latter remains on the surface of the substrate even after the film formation step, and causes an adverse effect on the quality of the film.

In the present invention, it is preferable that the surface processing which is carried out with use of a substance having a high adsorption heat with respect to the substance, or the surface processing which is carried out with use of substance containing a hydroxy group or a ketone group, should be carried out in the later step in the process, after the substrate cleaning process. In this manner, the time period in which the wafer is exposed to the atmosphere before the film formation step is made short, and the time of contacting or becoming close to a harmful non-volatile organic matter can be shortened. Consequently, the adsorption of a non-volatile organic matter onto the surface of a substrate can be prevented more effectively together with the above-described surface processing, and thus it becomes possible to form a thin film having an excellent film quality on a substrate.

It should be noted that the process using an organic compound having a high adsorption heat or the process using a substance containing a hydroxy group or a ketone group may be carried out on the substrate solely, or both of these processing, steps may be performed on the substrate.

Next, embodiments of the present invention will now be described in detail with reference to FIGS. 5 to 10.

A wafer cleaning/heat processing system 10 includes a cassette unit 30, a cleaning unit 40, a heat processing unit 50 and an interface unit 60. On a placement table 33 of the cassette unit 30, four cassettes C are placed such that wafers W can be unloaded one by one from a cassette C by means of an arm mechanism 34.

The cleaning unit 40 includes two cleaning units 45A and 45B, two surface processing units 200 and 300, two cooling units 44, two reversing units 43 and a main arm mechanism 41. The main arm mechanism 41 receives a wafer W from the arm mechanism 34 and transfers the wafer W to units 43 to 45. In the reversing unit 43, the wafer W is reversed so as to replace the front surface (on which a semiconductor device circuit is formed) with the rear surface. In a cooling/heating unit 44, the wafer is cooled or heated. In one cleaning unit 45A, the front surface of the wafer W is cleaned, and in the other cleaning unit 45B, the rear surface of the wafer W is cleaned.

The heat processing unit 50 is connected to the cleaning unit 40 via the interface unit 60. The heat processing unit 50 includes a vertical-type process tube 51, an arm mechanism 55, a heat insulating cover 54 and an elevator mechanism 61. The interface unit 60 includes a boat placement table 61, a boat transfer mechanism 63 and an arm mechanism 64. A plurality of boats B are placed to stand up vertically in the boat placement table 61. The arm mechanism 64 receives the wafer W from the main arm mechanism 41 and loads the wafer W into the boat B on the placement table 61. When the loading of all wafers W is completed, the boat B is horizontally moved by the transfer mechanism 63 to the loading position, and further placed on the heat insulating cover 54 by the arm mechanism 55. Thus, the wafers W are inserted together with the boat B to a process tube 51 by the elevator mechanism 61. In the process tube 51, heat oxidation films (silicon oxide films) are formed on the surfaces of a great number of silicon wafers W at once.

Next, the cleaning unit 45A for cleaning a front surface (on which a semiconductor device circuit is formed) will now be described with reference to FIG. 6.

The cleaning unit 45A has an ultraviolet ray lamp chamber 73 in an upper section and a processing chamber 71 in a lower section. Such an ultraviolet ray irradiation ozone washing device serving as a dry-type cleaning device is disclosed in Jpn. Pat. Appln. KOKAI Publication No. 9-219356 and U.S. patent application No. 08/791,617.

A load/unload opening 76 is made in a lateral surface of the processing chamber 71, and a substrate W is loaded into the processing chamber 71 via the load/unload opening 76 by means of a transfer arm (not shown), and then placed on the placement table 31. A plurality of support pins 82 are provided for the placement table 31 such that they are retractably projecting therefrom, and the wafer W is supported by these support pins 82.

The lamp chamber 73 is partitioned by a porous plate 74 into lower and upper parts, the light emitting unit of the lamp 72 is provided in the lower part. The lamp 72 is connected to an air supply source 100 such that clean air is supplied from the lamp 72 side towards the substrate W on the placement table.

It should be noted that the lamp 72 is supported to be ascendable/descendable by a cylinder 79 so that the distance from the lamp 72 to the substrate W can be adjusted.

An air introduction opening 97 and an exhaustion opening 98 are made in the upper part of the lamp chamber 73 such that the part can be exhausted while introducing new air thereinto. The newly introduced air flows into the lower part via pores 74a of the porous plate 74.

The processing chamber 71 and the lamp chamber 73 are insulated from each other by a shutter 78. When the shutter 78 is opened, the processing chamber 71 is connected to the lamp chamber 73 via an opening 77, such that an ultraviolet ray from the lamp 72 is irradiated onto the substrate W. When the lamp 72 is turned on, a main ultraviolet ray having a wavelength of 254 nm and a subordinate ultraviolet ray having a wavelength of 185 nm are emitted. Ozone is created from the air by the irradiation of the ultraviolet ray having a wavelength of 185 nm, and the thus created ozone is decomposed by the irradiation of the ultraviolet ray having a wavelength of 254 nm to create oxygen of a nascent group. When oxygen of the nascent group acts on an organic matter, the organic matter is decomposed to be gasified. Thus, the surface of the substrate can be cleaned.

Exhaustion openings 94 and 95 which communicate to an exhaustion passage 91 are made in the processing chamber 71, and the processing chamber 71 is exhausted by a collective exhaustion device 90 via the exhaustion passage 91.

Further, an exhaustion opening 96 which is communicated to the exhaust passage 92 is made in the lower portion of the lamp chamber 73, and thus it is possible to exhaust the interior of the lamp chamber 73 by the collective exhaustion device via the exhaustion passage 92.

Next, the cleaning unit 45B for cleaning the rear surface will now be described with reference to FIG. 7.

The cleaning unit 45B cleans the rear surface of the wafer W by scrubbing as a rotation brush 151 is made contact with the rear surface while spraying a cleaning solution thereto.

Such a brush scrub cleaning device is disclosed in Jpn. Pat. Appln. KOKAI Publication No. 9-162151. There are fiber type and sponge type for the rotation brush 151. In general, the fibered brush is used for cleaning the rear surface of a wafer, and the sponge brush is used for cleaning the front surface (on which a device circuit is formed) of a wafer. Apart from such a spray-type brush scrub cleaning device, the present invention can be applied to a wet-type cleaning device of MAIYOU disclosed in Jpn. Pat. Appln. KOKAI Publication No. 9-38595.

At a substantial center of the cleaning unit 45B, a spin chuck 121 is provided such as to hold and rotate a substrate W. An open/close shutter 125 is provided on a lateral surface of the unit. When the shutter 125 is opened, the interior of the unit 45B is communicated with the transfer passage, and substrate is transferred by the main arm mechanism 41 into the cleaning unit 45B.

A brush scrubber mechanism 123 and a jet nozzle mechanism 160 are provided on both sides of the spin chuck 121. The brush scrubber mechanism 123 includes a rotation brush 140 which rotates around a shaft 142, a swing arm 141 for supporting the rotation brush 140 by its tip end, and an oscillating mechanism 150 for oscillating the swing arm 141 around a vertical axis. It should be noted that the rotation brush 140, while standing by, is placed in a cup 151. For the rotation brush 140, a sponge brush can be used in place of the fibered brush.

The jet nozzle mechanism 160 includes a nozzle 162, a swing arm 161 for supporting the nozzle 162 by its tip end, and an oscillating mechanism 163 for oscillating the swing arm 161 around the vertical axis. It should be noted that while standing by, the nozzle 162 is placed in a cup 164.

Further, a cleaning liquid nozzle 122 is provided near the spin chuck 121, such that the cleaning liquid (for example, pure water) is applied to the substrate W while rotating. It should be noted that a nozzle (not shown) for spraying an aliphatic hydrocarbon solution such as of IPA may be separately provided in the cleaning unit 45B, so as to apply IPA or the like onto the surface of the substrate W by spraying.

As shown in FIG. 8, the surface processing unit 200 has a box 240, in which a placement table 241 and a cover 242 are provided. A plurality of spacers 244 are provided on the peripheral portion of the upper surface of the placement table 241, and a wafer W are supported by these spacers 244. With such a proximity supporting method, the contact between the wafer W and the placement table 241 by the entire surface can be avoided, and therefore the contamination of the wafer can be prevented. An alignment member 243 is fixed by a screw to each spacer 244, and thus the wafer W are automatically aligned.

The placement table 241 includes a plurality of lift pins 247. These lift pins 247 are supported by an ascending/descending mechanism 248 such that they project and retract from the placement table 241.

The cover 242 is provided directly above the placement table 241. The cover 242 is joined to a rod 239a of an ascending/descending cylinder 239. When the cover 242 is descended so as to cover the entire surface of the placement table 241, a process space 240a is created between the cover 242 and the wafer W.

A gas introduction opening 245 is made in the center portion of an upper plate 242a of the cover 242, and gas exhaustion openings 246 are provided on both sides thereof. The gas introduction opening 245 is connected to an IPA supplying device 250 via a supply pipe 249.

The IPA supply device 250 has a pot 251, and isopropyl alcohol (IPA) 252 is stored in the pot 152. A heater 255 is provided at a bottom portion of the pot 251, and thus IPA 252 is heated to generate vapor. End portions of pipes 253 and 249, which pierce through an upper cover 254 of the pot 251, are opened in the pot 251. The pipe 253 is connected to a pressurized gas supply source 258, and the tube 249 is connected to the cover 242. It should be noted that the operation of each of the pressurized gas supply source 258 and the heater power source 256 is controlled by a controlling device 269. When a pressurized nitrogen gas, for example, is introduced from the pressurized gas supply source 258 into the pot 251, IPA vapor is supplied to the cover 242 via a line 249, and further sprayed towards the substrate W. It should be noted that the interior of the unit 200 is exhausted via an exhaustion passage 238.

Next, another surface processing unit 300 will now be described with reference to FIG. 9.

The surface processing unit 300 has a box 302, in which a placement table 304 is provided. A plurality of spacers 306 are provided in the peripheral portion of the upper surface of the placement table 304, and the wafer W is supported by these spacers 306. With such a proximity supporting method, the contact between the wafer W and the placement table 304 by the entire surface can be avoided, and therefore the contamination of the wafer can be prevented. An alignment member 305 is fixed by a screw to each spacer 306, and thus the wafer W is automatically aligned.

A resin plate 307 is fit onto the upper surface of the placement table 304, and a heater 255 is buried directly underneath. The resin plate 307, when heated up to a predetermined temperature, generates gaseous triacontane ($C_{30}H_{62}$). It should be noted that a heater power source 309 is controlled by a controlling device 269.

Next, an example of the substrate processing method of the present invention will now be described with reference to the flowchart shown in FIG. 10.

A wafer W is loaded to the processing unit 40 from the cassette unit 30 by means of the transfer arms 34 and 41 (Step S1). The wafer W is transferred by the transfer arm 41 to the reversing unit 43, where the wafer W is reversed to turn over the front to back surface (Step S2). Further, the wafer W is transferred to the rear surface cleaning unit 45B, where the rear surface of the wafer W is cleaned by scrubbing and jetting (Step S3). Then, the wafer W is transferred by the transfer arm 41 to the reversing unit 43, where the wafer W is reversed to turn over the back to front surface (Step S4). Further, the wafer W is transferred to the front surface cleaning unit 45A, where the front surface of the wafer W is cleaned with ultraviolet ray irradiated ozone (Step S5).

The wafer W is transferred by the transfer arm 41 to the surface processing unit 200, where IPA is made adsorbed on the surface of the wafer W (Step S6). Note that it is also possible that the wafer W is reversed by the reversing unit 43 and the wafer W is transferred to the surface processing unit 300, such that triacontane is adsorbed on the surface of the wafer W (Step S6). Alternatively, it is possible that a surface processing substance is made adhered to the surface of a wafer W by applying an aliphatic hydrocarbon solution such as of IPA by spraying in the cleaning unit 45A or 45B (Step S6).

Wafers W are loaded into a boat B by the transfer arms 41 and 64, and the boat B containing the wafers W is inserted by the transfer arm 55 into the heat processing furnace 51, so as to perform a film formation process (Step S7). After the film formation process, the wafers W are cooled down to about room temperature by the cooling unit 44 (Step S8), and further the surface processing is carried out in the surface processing unit 200 or 300 (Step S9). Then, wafers W which have been processed are loaded in a cassette C, which is further unloaded from the cassette unit 30 to a subsequent step (Step S10).

Next, another embodiment in which the present invention is applied to a wet-type cleaning device other than the above, will now be described with reference to FIGS. 11 to 13.

As shown in FIG. 11, a washing device 400 consists mainly of a main body of a cleaning device 412, and an input buffer mechanism 413 and an output buffer mechanism 415 provided on the end portions of the cleaning device main body 412, respectively. A carrier transfer arm 417 for loading and unloading a wafer carrier 414 is provided for the input buffer mechanism 413 and the output buffer mechanism 415.

In the main body of the cleaning device 412, a plurality of processing vessels 418 each made of, for example, quarts, are arranged in line. In this embodiment, there are nine processing vessels 418 (that is, 418a to 418i), namely, from the input buffer mechanism 413 side in the order, a cleaning and drying processing vessel 418a of a wafer holding mechanism, a chemical liquid processing vessel 418b, a water washing processing vessel 418c, a water washing processing vessel 418d, a chemical liquid processing vessel 418e, a water washing processing vessel 418f, a water washing processing vessel 418g, a non-volatile organic matter adsorption preventing processing vessel (to be called as adsorption preventing processing vessel hereinafter) 418h, a wafer drying processing vessel 418i and the like.

Further, on a side of these processing vessels 418, a transfer mechanism 419 for holding a plurality of, for example, 50 semiconductor wafers, by a wafer holding mechanism, and for transferring these semiconductor wafers in the vertical and horizontal directions, is provided. In this embodiment, there are three transfer mechanisms 419, and the range of the transfer by each mechanism is limited, thus preventing, for example, the mixture of the chemical liquid in the chemical liquid processing vessel 418b into the chemical liquid processing vessel 418e.

The chemical liquid processing vessel 418b, the water washing processing vessel 418c, the water washing processing vessel 418d, the chemical liquid processing vessel 418e, the water washing processing vessel 418f, the water washing processing vessel 418g, and: the adsorption preventing processing vessel 418h, have a structure, for example, as shown in FIG. 12. These processing vessels 18 are of a spray type. As can be seen in FIG. 12, a placement table 422 on which wafers W are placed, is provided in a container 421. On the bottom portion of the container 421, an exhaustion pipe 423 for exhausting a processing liquid is provided. Further, on the upper portion of the container 421, a container unit 424 for receiving a processing liquid when the processing liquid is over-flown.

Further, at the upper portion of the container 421, a spray nozzle 425 for spraying the processing liquid onto the wafers W is provided. A processing solution pipe 426 is provided for the spray nozzle 425, and a valve 427 for controlling the supply of the processing liquid is provided for the processing liquid pipe 426. Further, the processing liquid pipe 426 is connected to a processing liquid tank 428 for containing the processing liquid.

In the processing vessel having a structure described as above, each wafer W is transferred by the transfer mechanism 419 to the placement unit 422 and then the valve 427 is opened, thus supplying the processing liquid onto the surfaces of the wafers W via the spray nozzle 427.

In the case where the cleaning process and adsorption preventing process are carried out with the cleaning device having the above structure, a wafer carrier 414 is moved to a standby position by a carrier conveying arm 417 of an input buffer mechanism 413, and a semiconductor wafer is held by the conveying mechanism 419. With the cleaning/drying processing vessels 418a of the wafer holding mechanism, the wafer holding mechanism of the conveying mechanism 419 is cleaned and dried in advance.

After that, these wafers are transferred by the transfer mechanism 419 to the chemical liquid processing vessel 418b, the water washing processing vessel 418c, the water washing processing vessel 418d, the chemical liquid processing vessel 418e, the water washing processing vessel 418f, the water washing processing vessel 418g, the adsorption preventing processing vessel 418h and the wafer drying processing vessel 418i, in the order, and the cleaning process and adsorption preventing process are carried out in the order of the chemical processing, water washing processing, water washing process, chemical liquid processing, water washing process, water washing process and the adsorption preventing process.

After that, wafers are loaded in the wafer carrier 414 at the standby position for the output buffer mechanism 415 by the transfer mechanism 419. Thus, those wafers which have been subjected to the adsorption preventing process are sent to the film forming step, which is carried out in later stage, where the process is carried out on the wafer film formation.

In the above description, the processing vessel 418 used here is of a spray type; however the processing vessel 418 may be of an immersion type as shown in FIG. 13, where a wafer W is immersed in the container 421, or it may have a structure in which the interior of the container is made to have a gaseous processing liquid atmosphere, and wafers W are exposed to the interior (that is, an atmosphere type). Alternatively, the processing vessel 418 may have a structure in which a spray type, an immersion type and an atmosphere type are combined together.

The following are descriptions of examples which were carried out in order to clarify the effect of the present invention.

EXAMPLE 1

A 6-inch wafer was cleaned within the above-described cleaning device and dried. During this period, in the adsorption preventing processing vessel, the wafer was exposed to an atmosphere of triacontane ($C_{30}H_{62}$) having an adsorption heat of 150 kJ/mol, so as to make triacontane adsorbed on the surface of the wafer. After that, the wafer was loaded in the CVD furnace, and a silicon oxide film having a thickness of 10 nm was formed as a gate insulation film, on the wafer by means of CVD. Further, a polysilicon film having a thickness of 200 nm was formed as a gate electrode, on the silicon oxide film, so as to manufacture an MOS diode.

With regard to the above-described device, the yield was examined in terms of the withstand voltage of the oxide film by the evaluation of the current-voltage characteristics, and it was 99%. The reason for this is considered to be as follows. That is, triacontane adsorbed onto the surface of the wafer W in advance of the formation of the polysilicon film has an adsorption heat higher than those of organic matters such as DOP and phosphate ester, which cause an adverse effect on the yield of the withstand voltage of the oxide film.

Therefore, it is not replaced by DOP or phosphate ester during the standing time period after the washing, and thus the adsorption of DOP or phosphate ester onto the surface of a wafer W can be prevented. It should be noted that triacontane was removed from the wafer as it evaporated (vaporized) due to the heat (about 600° C.) in the furnace, and therefore it did not cause any adverse effect on the yield in terms of the withstand voltage of the gate insulation film.

Comparative Example 1

A device was formed in the same manner as that of Example 1 except that triacontane ($C_{30}H_{62}$) was adsorbed on the surface of a wafer, and the yield in terms of the withstand voltage of the oxide film was examined and was 85%. The reason for this is considered to be that organic matters such as DOP and phosphate ester, which cause an adverse effect on the yield in terms of the withstand voltage of the oxide film, were adsorbed on the surface of the wafer before the formation of the polysilicon film.

EXAMPLE 2

A 6-inch wafer was cleaned within the above-described cleaning device and dried. During this period, in the chemical liquid processing vessel, the wafer was immersed to a 1% -HF solution. As a result, the surface of the wafer became hydrophobic. Further, in the adsorption preventing processing vessel, the wafer W is immersed in isopropyl alcohol so as to cover the surface of the wafer W with isopropyl alcohol. After that, the wafer was loaded in the CVD furnace, and a silicon oxide film having a thickness of 10 nm was formed as a gate insulation film, on the wafer by means of CVD. Further, a polysilicon film having a thickness of 200 nm was formed as a gate electrode, on the silicon oxide film, so as to manufacture an MOS diode.

With regard to the above-described device, the yield was examined in terms of the withstand voltage of the oxide film by the evaluation of the current-voltage characteristics, and it was 99%. The reason for this is considered to be as follows. That is, isopropyl alcohol provided to cover the surface of the wafer W in advance of the formation of the polysilicon film, served to prevent the adsorption of DOP (dioctyl phthalate), which causes an adverse effect on the yield of the withstand voltage of the oxide film. It should be noted that triacontane was removed from the wafer as it evaporated (vaporized) due to the heat (about 600° C.) in the furnace, and therefore it did not cause any adverse effect on the yield in terms of the withstand voltage of the gate insulation film.

Comparative Example 2

A device was formed in the same manner as that of Example 2 except that the process of covering the surface of the wafer W with isopropyl alcohol was not carried out, and the yield in terms of the withstand voltage of the oxide film was examined and was 82%. The reason for this is considered to be that organic matters such as DOP and the like, which cause an adverse effect on the yield in terms of the withstand voltage of the oxide film, were adsorbed on the surface of the wafer before the formation of the gate insulation film.

The above examples are described in connection with the case where a semiconductor wafer is used as a substrate; however the present invention is not limited to this case, but can be applied to the case where the substrate is an LCD substrate. Further, in the present invention, the number of processing vessels in the cleaning device, the arrangement of the processing vessels, the timing for carrying out the adsorption preventing device, and the like are not limited.

It should be noted that the above examples are described in connection with the case where a batch furnace was used in the film forming step; however the present invention is not limited to this case, but it can be applied to a process which uses a one-by-one type CVD furnace.

As described above, in the substrate processing method and the cleaning device used therefor, according to the present invention, when the film forming process is carried out on a substrate, a surface processing is carried out on the substrate with use of a substance having a high adsorption heat with respect to the substrate before the film forming process, or the processing is carried out with use of a substrate containing a hydroxy group prior to the film forming process. Therefore, the adsorption of a non-volatile organic matter onto the substrate in the processing atmosphere, can be prevented, and thus the deterioration of the quality of the film thus formed can be avoided.

Next, the results of the detection and measurement of the amount of an organic matter adsorbed on the surfaces of the substrates as released from the cleaning device as an out gas will now be described with reference to FIGS. 14 to 27.

FIG. 14 is a graph showing the results of the examination of between a peak area (A.U.) obtained by the analysis of a gas having passed through TENAX (collector of porous beads) using a gas chromatography, taken in the abscissa, and an amount (ng) of an organic matter adsorbed onto the surface of a substrate, taken in the ordinate. As the value of the abscissa increases, it indicates that the substance is present more in the atmosphere, and as the value of the ordinate increases, it indicates that the substance is adsorbed more on the sur face of the wafer. The amount of an organic matter adsorbed was obtained by dividing the amount (ng) of the organic matter adsorbed on the collector (TENAX) when the gas is allowed to flow for 12 hours by the area ($cm^2$) per 6-inch silicon wafer. The "TENAX" is an aggregate made of a great number of porous beads having a polarity. These results were obtained in the measurements carried out at room temperature and under atmospheric pressure.

In FIG. 14, the black circle represents propanic acid ester, the inverse black triangle represents dibutyl phthalate (DBP), the black triangle represents dioctyl phthalate (DOP), the white circle represents N-butylbenzenesulfonylamine, the white triangle represents ethanol 1,2-chloro-phosphate, the inverse white triangle represents adipic dioctylester, the white square represents cyclic siloxane (D9) having 9 silicon atoms, the white diamond represents cyclic siloxane (D10) having 10 silicon atoms, the white star represents cyclic siloxane (D11) having 11 silicon atoms, the black square represents benzene methyl, and the black diamond represents benzene 1,2-dimethyl. The results thus obtained indicated that these organic compounds are divided into three groups of A, B and C. As shown, with regard to propanic acid ester, DBP, DOP and the like, which belong to the group A, the amount of the material adsorbed on the surface of the wafer increased in substantially proportional to the concentration in the atmosphere. However, N-butylbenzenesulfonylamine, ethanol1, 2-chloro-phosphate, adipic dioctylester, and cyclic siloxanes having 9 to 11 silicon atoms (D9, D10, D11), which belong to the group B, were detected as adsorbed matters on the surface of the wafer although they were not substantially detected within the atmosphere. This indicates that the organic compounds which belong to the group B each have a high adsorption property. By contrast, methyl benzene and benzene 1,2-dimethyl, which belong to the group C were not at all detected on the surface of the wafer although the concentrations within the atmosphere were high. This indicates that the organic compounds which belong to the group C were not at all adsorbed onto the surface of the wafer.

As is clear from the above, it has been clarified that the cyclic siloxanes can be very easily adsorbed onto the surface (which is hydrophilic) of a silicon wafer, whereas the hydrocarbon-based benzene compounds can hardly be adsorbed on the surface (which is hydrophilic) of a silicon wafer.

FIG. 15 is a graph showing the relationship between the boiling point (° C.), taken in the abscissa, and gas chromatography retention time (minute), taken in the ordinate, for various types of organic compounds. The "retention time", here means the time required for the component of the object of the analysis to dissolve in a gas chromatography. In the figure, the white square indicates siloxane, the black triangle indicates phthalate ester, the white triangle indicates phosphate ester and the black square indicates hydrocarbon. As is clear from the figure, in a range of 100 to 400° C., there is a proportional relationship between the boiling point and the retention time. According to Chemical Engineering Handbook, there are relationships represented by the following formulas (1) and (2) among three properties, "boiling point", "vaporization heat" and "adsorption heat" of an organic compound. It should be noted that the formulas (1) and (2) are empirical formulas.

$$EQ = -2950 + 23.7 BP + 0.02(BP)^2 \quad (1)$$

$$AQ = 1.6 \times EQ \quad (2)$$

wherein BP is the boiling point (° C.), EQ is the evaporation heat (cal/mol) and AQ is the adsorption heat (cal/mol).

From these, it is deduced that an organic compound having a high boiling point has a high adsorption heat and an organic compound having a low boiling point has a low adsorption heat.

FIG. 16 is a graph showing the results of the examination on the relationship between the time for which the wafer is let stand (h), taken in the abscissa, and the detected amount (ng) of organic matter attached to the surface of a 6-inch diameter wafer, taken in the ordinate, for various types of surface states of wafers. Silicon wafers having various types of surfaces were let stand in a clean room equipped with a chemical filter, and measured. A silicon wafer which was subjected to wet-type cleaning with a hydrofluoric acid is assigned to be Sample I, a silicon wafer having a silicon oxide film formed by a thermal oxidation method is assigned to be Sample II, and a silicon wafer which was subjected to dry-type cleaning with ozone under the irradiation of ultraviolet ray. In the figure, the white circle indicates the result of the amount of the organic matter adsorbed on the Sample I, the black square indicates the result of the amount of the organic matter adsorbed on the Sample II, and:the white triangle indicates the result of the amount of the organic matter adsorbed on the Sample III. When the standing time is set at 1 hour, 3 hours, 12 hours and 69 hours, the amount of the organic matter was detected as follows. That is, for the Sample I, the amounts were 331 ng, 515 ng, 654 ng and 750 ng, respectively for the hours, for the Sample II, the amounts were 562 ng, 724 ng, 1012 ng and 1397 ng, respectively, and for the Sample III, the amounts were 665 ng., 1069 ng, 1531 ng and 1367 ng, respectively. As described, it has been found that, even in a clean room equipped with a chemical filter, a great amount of the organic matters are adsorbed in any case of the samples I, II and III, even for a short period of time. Further, it has been found that the amount of the organic matter adsorbed is more on the heat oxide film surface (Sample II) and the dry type cleaning surface (Sample III) than on the wet type cleaning surface (Sample I). Further, it has been found that when the standing time is 12 hours or more, the amount of the organic matter adsorbed is substantially saturated.

FIG. 17 is a graph which examines the amount of the out gas from a resin material, by taking the abscissa for the type of resin material and taking the ordinate for the total value (ng/liter) of the detected amounts of the main organic matters out of those released from these resin materials. The out gas was detected under the following conditions. That is, sample resins A to E were heated up to 120° C. in a closed container, and a clean air was allowed to flow therein. Then, the amount of organic matters contained in 1 liter of air was measured by gas chromatography. The main organic matters were the following five matters, namely, butylhydroxy toluene (BHT), adipic acid ester, phthalate ester, phosphate ester and siloxane. The total value of the main organic matter detection amounts for the resin A was 45.67 ng, the total value for the resin B was 2.60 ng, the total value for the resin C was 259.10 ng, the total value for the resin D was 86.677 ng and the total value for the resin E was 59.493 ng. Of these, the resin C released the greatest amount of gaseous organic matters. The most of the out gas was siloxane. By contrast, the amount of the gaseous organic matter released from the resin B was extremely small.

FIG. 18 is a graph which examines the total amount of the out gas from a resin material, by taking the abscissa for the type of resin material and taking the ordinate for the maximum, minimum and average of the detected amounts (ng) of the main organic matters released from these resin materials. The out gas was detected under the following conditions. That is, sample resins A to E were heated up to 120° C. in a closed container, and clean air was allowed to flow therein. Then, the amount of organic matters contained in 6 liters of air was measured by gas chromatography. The maximum, minimum and average values of all the organic matters for each sample were, respectively, 14770 ng, 3029 ng and 8311 ng for the resin A, 293 ng, 30 ng and 141 ng for the resin B, 18680 ng, 3754 ng and 6742 ng for the resin C, 21500 ng, 201 ng and 7173 ng for the resin D, and 18250 ng, 707 ng and 6419 ng for the resin E.

FIG. 19 is a graph which examines the amount of BHT released from a resin material, by taking the abscissa for the type of resin material and taking the ordinate for the maximum, minimum and average of the detected amounts (ng) of BHT released from these resin materials. BHT was detected under the following conditions. That is, sample resins A to E were heated up to 120° C. in a closed container, and clean air was allowed to flow therein. Then, the amount of BHT contained in 6 liters of air was measured by gas chromatography. The maximum, minimum and average values of BHT for each sample were, respectively, 220 ng, 160 ng and 190 ng for the resin A, 0.5 ng, zero (not detected) and 0.1 ng for the resin B, 129 ng, 0.8 ng and 51 ng for the resin C, 279 ng, 0.6 ng and 67 ng for the resin D, and 640 ng, 0.2 ng and 215 ng for the resin E.

FIG. 20 is a graph which examines the amount of adipic acid ester released from a resin material, by taking the abscissa for the type of resin material and taking the ordinate for the maximum, minimum and average of the detected amounts (ng) of adipic acid ester released from these resin materials. The adipic acid ester was detected under the following conditions. That is, sample resins A to E were heated up to 120° C. in a closed container, and clean air was allowed to flow therein. Then, the amount of adipic acid ester contained in 6 liters of air was measured by gas chromatography. The maximum, minimum and average values of adipic acid ester for each sample were, respectively, 29 ng, 1 ng and 9 ng for the resin A, 0.8 ng, zero (not detected) and 0.2 ng for the resin B, 9 ng, 1 ng and 4 ng for the resin C, 393 ng, 0.1 ng and 85 ng for the resin D, and 36 ng, 0.1 ng and 14 ng for the resin E.

FIG. 21 is a graph which examines the amount of phthalate ester released from a resin material, by taking the abscissa for the type of resin material and taking the ordinate for the maximum, minimum and average of the detected amounts (ng) of phthalate ester released from these resin materials. The phthalate ester was detected under the following conditions. That is, sample resins A to E were heated up to 120° C. in a closed container, and clean air was allowed to flow therein. Then, the amount of phthalate ester contained in 6 liters of air was measured by gas chromatography. The maximum, minimum and average values of phthalate ester for each sample were, respectively, 40 ng, 3 ng and 28 ng for the resin A, 34 ng, 2 ng and 11 ng for the resin B, 126 ng, 21 ng and 55 ng for the resin C, 1706 ng, 3 ng and 310 ng for the resin D, and 147 ng, 25 ng and 104 ng for the resin E.

FIG. 22 is a graph which examines the amount of phosphate ester released from a resin material, by taking the abscissa for the type of resin material and taking the ordinate for the maximum, minimum and average of the detected amounts (ng) of phosphate ester released from these resin materials. The phosphate ester was detected under the following conditions. That is, sample resins A to E were heated up to 120° C. in a closed container, and clean air was allowed to flow therein. Then, the amount of phosphate ester contained in 6 liters of air was measured by gas chromatography. The maximum, minimum and average values of phosphate ester for each sample were, respectively, 58 ng, 10 ng and 33 ng for the resin A, 1.2 ng, zero (not detected) and 0.3 ng for the resin B, 108 ng, 3 ng and 56 ng for the resin C, 104 ng, zero (not detected) and 27 ng for the resin D, and 4 ng, 0.6 ng and 2 ng for the resin E.

FIG. 23 is a graph which examines the amount of siloxane released from a resin material, by taking the abscissa for the type of resin material and taking the ordinate for the maximum, minimum and average of the detected amounts (ng) of siloxane released from these resin materials. The siloxane was detected under the following conditions. That is, sample resins A to E were heated up to 120° C. in a closed container, and clean air was allowed to flow therein. Then, the amount of siloxane contained in 6 liters of air was measured by gas chromatography. The maximum, minimum and average values of siloxane for each sample were, respectively, 21 ng, 7 ng and 14 ng for the resin A, 9 ng, 0.3 ng and 4 ng for the resin B, 7459 ng, 743 ng and 1366 ng for the resin C, 151 ng, 8 ng and 31 ng for the resin D, and 46 ng, 5 ng and 22 ng for the resin E.

FIG. 24 is a three-dimensional graph showing the results of the examination of the amounts of gaseous organic components for various temperatures, 60° C., 90° C. and 120° C., by taking the abscissa for the type of organic component and taking the ordinate for the amounts (ng/6 liter) of gaseous organic components released from a Sample 1-1 of the parts. The organic components subjected to the examination were, from the lightest one in the order, triethylphosphate (TEP), cyclic siloxane (D6), butylhydroxytoluene (BHT), diethylphthalate (DEP), tributylphosphate (TBP), adipic acid (DBA), trichloroethylphophate (TCEP), dibutylphthalate (DBP), dioctyl adipate (DOA), tripropylphosphate (TPP), di-dioctylphthalate (DOP) and tricresylphosphate (TCP). From the above, it has been found that in both cases of BHT and DEP, the amount of release of a gaseous organic component has a strong temperature-dependency. More specifically, the amount of release of BHT (the total of 2 samples) was 66 ng at 60° C., 14 ng at 90° C., 574 ng at 120° C., and the amount of release of DEP (the total of 2 samples) was 6 ng at 60° C., 9 ng at 90° C., 296 ng at 120° C. It should be particularly noted that both BHT and DEP showed high detection values at 120° C.

FIG. 25 is a three-dimensional graph showing the results of the examination of the amounts of gaseous organic components for various temperatures, 60° C., 90° C. and 120° C., by taking the abscissa for the type of organic component and taking the ordinate for the amounts (ng/6 liter) of gaseous organic components released from a Sample 1-3 of the parts. The organic components subjected to the examination were the same as above. From the above, it has been found that in both cases of BHT and DEP, the amount of release of a gaseous organic component has a strong temperature-dependency. More specifically, the amount of release of BHT (the total of 2 samples) was 38 ng at 60° C., 33 ng at 90° C., 183 ng at 120° C., and the amount of release of DEP (the total of 2 samples) was 6 ng at 60° C., 6 ng at 90° C. and 227 ng at 120° C. It should be particularly noted that BHT showed a high detection value at 120° C. In the meantime, DBA showed high detection values at all the temperatures. That is, the amount of release of DBA (the total amount of 2 samples) was 92 ng at 60° C., 112 ng at 90° C. and 138 ng at 120° C.

FIG. 26 is a three-dimensional graph showing the results of the examination of the amounts of gaseous organic components for various temperatures, 60° C., 90° C. and 120° C., by taking the abscissa for the type of organic component and taking the ordinate for the amounts (ng/6 liter) of gaseous organic components released from a Sample 9-3 of the parts. The organic components subjected to the examination were the same as above. From the above, it has been found that in both cases of TBP and DBP, the amount of release of a gaseous organic component has a strong temperature-dependency. More specifically, the amount of release of TBP (the total of 2 samples) was 5 ng at 60° C., 601 ng at 90° C. and 2463 ng at 120° C., and the amount of release of DBP (the total of 2 samples) was 7 ng at 60° C., 67 ng at 90° C. and 404 ng at 120° C. It should be particularly noted that TBP showed a high detection value at 120° C. In the meantime, the amount of cyclic siloxane (D6) showed an inverse temperature-dependency. That is, the amount of release of D6 (the total amount of 2 samples) was 415 ng at 60° C., 454 ng at 90° C. and 27 ng at 120° C.

FIG. 27 is a three-dimensional graph showing the results of the examination of the amounts of gaseous organic components for various temperatures, 60° C., 90° C. and 120° C., by taking the abscissa for the type of organic component and taking the ordinate for the amounts (ng/6 liter) of gaseous organic components released from a Sample 14-15 of the parts. The organic components subjected to the examination were the same as above. From the above, it has been found that in all cases of TBP, TCEP and TPP, the amount of release of a gaseous organic component has a strong temperature-dependency. More specifically, the amount of release of TBP (the total amount of 2 samples) was 4328 ng at 60° C., 9405 ng at 90° C. and 14104 ng at 120° C., the amount of release of TCEP (the total amount of 2 samples) was 1097 ng at 60° C., 8032 ng at 90° C. and 17120 ng at 120° C., and the amount of release of TPP (the total amount of 2 samples) was 11 ng at 60° C., 2185 ng at 90° C. and 3714 ng at 120° C. It should be particularly noted that both of TBP and TCEP showed high detection values at temperatures of 90° C. or higher.

The examples were explained in connection with the case where the substrate to be processed is a semiconductor wafer; however the present invention is not limited to such a case, but it can be applied to some other substrate such as a glass substrate for a liquid crystal device.

The examples were explained in connection with the case where the batch-type spray cleaning device and a one-by-one-type ultraviolet ray irradiation:ozone cleaning device were used as cleaning devices; however the present invention is not limited to such a case, but it can be applied to some other devices such as a wet-type cleaning device and dry-type device.

6. INDUSTRIAL APPLICABILITY

In the present invention, it is preferable that one surface process using a substance having a high adsorption heat with respect to a substrate, and another surface process using a substance containing a hydroxy group or a ketone group, should be carried out in the process after the substrate cleaning step. As the surface processing substance, aliphatic hydrocarbon is preferable but aromatic hydrocarbon is not preferable. The former decomposes in the film formation step and vanishes from the surface of the substrate, thus causing no substantial influence on the quality of the film, but the latter remains on the surface of the substrate even after the film formation step, thereby causing an adverse influence on the quality of the film.

With the processing steps carried out on the surface of the substrate, the time period in which the substrate is exposed to air until the later film formation process is shortened, and therefore the time period of the contact with a harmful non-volatile organic material for the manufacture of semiconductor devices can be shortened. Consequently, the adsorption of a non-volatile organic matter onto the surface of a substrate can be prevented more effectively together with the above-described surface processing steps, and it becomes possible to form a thin film having an excellent quality on the substrate.

What is claimed is:

1. A substrate processing method of processing a surface of a substrate in manufacturing a semiconductor device, the method comprising:

(a) processing a surface for making a substance having an adsorption heat higher than that of an organic matter whose adsorption on the surface of the substrate, which has been cleaned, is undesirable, adsorbed on the surface of the substrate;

(b) removing the substance adsorbed on the surface of the substrate and forming a thin film on the surface of the substrate from which the substance was removed.

2. A substrate processing method according to claim 1, wherein the substance having an adsorption heat higher than that of dioctyl phthalate is adsorbed on the surface of the substrate.

3. A substrate processing method according to claim 1, wherein, an organic compound of aliphatic hydrocarbons is adsorbed on the surface of the substrate.

4. A substrate processing method according to claim 1, wherein triacontane is adsorbed on the surface of the substrate.

5. A substrate processing method according to claim 1, wherein after (b), the substance of (a) is adsorbed on the surface of the substrate, on which the film was formed.

6. A substrate processing method according to claim 1, wherein before (a), the surface of the substrate is subjected to a cleaning process, so as to remove organic matters from the surface of the substrate.

7. A substrate processing method according to claim 1, wherein before (a), the surface of the substrate is cleaned by a dry-type cleaning.

8. A substrate processing method according to claim 1, wherein before (a), the surface of the substrate is cleaned by a wet-type cleaning.

9. A substrate processing method according to claim 1, wherein in (b), a thermal oxide film is formed on the surface of the substrate.

10. A substrate processing method according to claim 1, wherein in (a), a substance containing a hydroxy group or a ketone group is adsorbed the surface of the substrate.

11. A substrate processing method according to claim 1, wherein the surface of the substrate is hydrophobic.

12. A substrate processing method of processing a surface of a substrate in manufacture of a semiconductor device, characterized by comprising:

(A) processing a surface for making a substance containing a hydroxy group or a ketone group, adsorbed on the surface of the substrate; and (B) removing the substance adsorbed on the surface of the substrate and forming a thin film on the surface of the substrate from which the substance was removed.

13. A substrate processing method according to claim 12, wherein in (A), an organic compound of aliphatic hydrocarbons is adsorbed on the surface of the substrate.

14. A substrate processing method according to claim 12, wherein in (A), one or more organic compounds selected from the group consisting of isopropyl alcohol, 2-ethylhexanol, methyl alcohol and ethyl alcohol is adsorbed as a substance containing a hydroxy group, on the surface of the substrate, and one or more organic compounds selected from the group consisting of acetone and methyethyl ketone, is adsorbed as a substance containing a ketone group.

15. A substrate processing method according to claim 12, wherein after (B), the substance of (A) is adsorbed on the surface of the substrate, on which the film was formed.

16. A substrate processing method according to claim 12, wherein before (A), the surface of the substrate is subjected to a cleaning, so as to remove organic matters from the surface of the substrate.

17. A substrate processing method according to claim 12, wherein before (A), the surface of the substrate is cleaned by a dry-type cleaning.

18. A substrate processing method according to claim 12, wherein before (A), the surface of the substrate is cleaned by a wet-type cleaning.

19. A substrate processing method according to claim 12, wherein in (B), a thermal oxide film is formed on the surface of the substrate.

20. A substrate processing method according to claim 12, wherein in (A), a substance having an adsorption heat higher than that of an organic matter whose adsorption on the surface of the substrate, which has been cleaned, is undesirable, is adsorbed on the surface of the substrate.

21. A substrate processing method according to claim 12, wherein the surface of the substrate is hydrophobic.

22. A substrate processing method according to claim 1 wherein said substance removing and film formation step includes a step for heating the substrate to decompose or evaporate the substance adsorbed on the surface of the substrate so that the substance is removed therefrom and thereafter forming the thin film.

23. A substrate processing method according to claim 1 wherein said substance removing and film formation step includes a step for continuously heating the substrate to decompose or evaporate the substance adsorbed on the surface of the substrate so that the substance is removed therefrom and to form the thin film.

* * * * *